US007021419B2

(12) United States Patent
Sadaie et al.

(10) Patent No.: US 7,021,419 B2
(45) Date of Patent: Apr. 4, 2006

(54) SPEAKER SYSTEM

(75) Inventors: Koichi Sadaie, Neyagawa (JP); Kenichiro Toyofuku, Neyagawa (JP)

(73) Assignee: Onkyo Corporation, Osaka (JP)

( * ) Notice: Subject to any disclaimer, the term of this patent is extended or adjusted under 35 U.S.C. 154(b) by 53 days.

(21) Appl. No.: 10/897,730

(22) Filed: Jul. 22, 2004

(65) Prior Publication Data

US 2005/0039975 A1 Feb. 24, 2005

Related U.S. Application Data

(62) Division of application No. 09/914,540, filed on Aug. 29, 2001, now Pat. No. 6,798,891.

(30) Foreign Application Priority Data

| | | |
|---|---|---|
| Mar. 3, 1999 | (JP) | 11-055942 |
| Apr. 13, 1999 | (JP) | 11-105311 |
| Nov. 12, 1999 | (JP) | 11-322365 |
| Feb. 29, 2000 | (WO) | PCT/JP00/01176 |

(51) Int. Cl.

| | |
|---|---|
| ***H05K 5/02*** | (2006.01) |
| ***H04R 1/28*** | (2006.01) |
| ***H04R 1/34*** | (2006.01) |

(52) U.S. Cl. ...................... 181/156; 181/144; 181/145; 181/151; 381/335; 381/354; 381/186

(58) Field of Classification Search ................ 181/156, 181/144, 145, 151; 381/335, 354, 186

See application file for complete search history.

(56) References Cited

U.S. PATENT DOCUMENTS

| | | | | |
|---|---|---|---|---|
| 2,969,848 | A * | 1/1961 | Farwell | 181/145 |
| 4,142,603 | A * | 3/1979 | Johnson | 181/148 |
| 4,326,099 | A | 4/1982 | Maille | |
| 4,704,729 | A | 11/1987 | Franzini et al. | |
| 4,733,749 | A | 3/1988 | Newman et al. | |
| 5,012,890 | A | 5/1991 | Nagi et al. | |
| 5,109,422 | A * | 4/1992 | Furukawa | 381/96 |
| 5,255,321 | A * | 10/1993 | Murray et al. | 381/71.7 |
| 5,714,721 | A * | 2/1998 | Gawronski et al. | 181/156 |
| 5,895,896 | A * | 4/1999 | Alton, Jr. | 181/145 |
| 6,237,715 | B1 * | 5/2001 | Tracy | 181/156 |
| 6,275,597 | B1 * | 8/2001 | Roozen et al. | 381/345 |
| 6,343,134 | B1 | 1/2002 | Czerwinski | |
| 6,604,602 | B1 * | 8/2003 | Kim | 181/199 |
| 6,801,633 | B1 * | 10/2004 | Tracy | 381/389 |
| 2004/0173402 | A1 * | 9/2004 | Morkerken | 181/151 |

FOREIGN PATENT DOCUMENTS

| | | | |
|---|---|---|---|
| DE | 4019645 | A1 * | 1/1991 |
| EP | 0 390 123 | A | 10/1990 |

(Continued)

*Primary Examiner*—Edgardo San Martin
(74) *Attorney, Agent, or Firm*—The Webb Law Firm

(57) ABSTRACT

A small-sized speaker system having a very excellent bass-range reproduction capability includes a sound radiation component for guiding acoustic waves radiated from the speaker units to a free space by causing a larger degree of air compression and expansion than in the case where acoustic waves are directly radiated to the free space with the speaker units mounted in corresponding enclosures of the same shape as the speaker units. The speaker system has 20% or more lower f0 than in the case where acoustic waves are directly radiated to the free space with the speaker units mounted in corresponding enclosures of the same shape as the speaker units.

26 Claims, 20 Drawing Sheets

FOREIGN PATENT DOCUMENTS

| | | | | |
|---|---|---|---|---|
| JP | 50-39123 | A | | 4/1975 |
| JP | 1-78487 | A | | 5/1989 |
| JP | 4-151997 | A | | 5/1992 |
| JP | 05122785 | A | * | 5/1993 |
| JP | 5-82190 | | | 11/1993 |
| JP | 9-130886 | A | | 5/1997 |
| JP | 9-149487 | A | | 6/1997 |
| JP | 2002078052 | A | * | 3/2002 |

* cited by examiner

SPEAKER SYSTEM

CROSS REFERENCE TO RELATED APPLICATION

This application is a divisional of U.S. patent application Ser. No. 09/914,540, filed Aug. 29, 2001, now U.S. Pat. No. 6,798,891 issued Sep. 28, 2004, which is incorporated herein by reference.

BACKGROUND OF THE INVENTION

1. Field of the Invention

The present invention relates to a speaker system. In particular, the present invention relates to a small-sized speaker system having a very excellent bass-range reproduction capability.

2. Description of the Prior Art

Many attempts have been made for many years to reproduce bass with small-sized speakers. For example, Japanese Patent Laid-Open Publication No. 50-39123 describes a technique for opposing speaker units to each other to synthesize acoustic waves. This publication describes the capability of increasing the sound pressure of bass by synthesizing acoustic waves, which was difficult to implement with previous small-sized speakers.

The technique described in the above publication increases the sound pressure by outputting acoustic waves from the two speaker units in such a manner that the acoustic waves have an identical phase, amplitude, and waveform. Thus, the technique cannot widen a bass reproduction band using the small-sized speakers.

In addition, in order to assist bass reproduction carried out by the small-sized speakers, a technique has been proposed which uses port tubes to increase deep bass reproduction. This technique, however, is disadvantageous in that it may be subjected to wind noise to reduce the sound quality. Further, the conventional technique using port tubes has not been reported to fully widen the bass reproduction band.

As described above, in the field of small-sized woofers, the object to widen the bass reproduction band without reducing the sound quality has not been attained for many years.

The present invention is provided to solve this conventional problem, and it is an object thereof to provide a small-sized speaker system having a very excellent bass-range reproduction capability.

SUMMARY OF THE INVENTION

A speaker system according to the present invention comprises: speaker units; and a sound radiation component for guiding acoustic waves radiated from the speaker system to a free space by causing a larger degree of air compression and expansion than in the case where acoustic waves are directly radiated to the free space with the speaker units mounted in corresponding enclosures of the same shape as the speaker units, so that the speaker system has 20% or more lower f0 than in the case where acoustic waves are directly radiated to the free space with the speaker units mounted in corresponding enclosures of the same shape as the speaker units.

Another speaker system according to the present invention comprises: a first speaker unit mounted in a first enclosure; a second speaker unit mounted in a second enclosure; and an intermediate member disposed between the first and second enclosures in such a manner that the first and second speaker units are opposed to each other at a predetermined distance, the intermediate member defining together with the first and second enclosures, a sound radiation component for guiding acoustic waves radiated from the first and second speaker units out to a free space, so that the speaker system has 20% or more lower f0 than in the case where acoustic waves are directly radiated to the free space with the speaker units mounted in corresponding enclosures of the same shape as the speaker units.

In a preferred embodiment, the first and second speaker units are identical.

Yet another speaker system according to the present invention comprises: a speaker unit mounted in an enclosure; a wall member opposed to the speaker unit at a predetermined distance; and an intermediate member provided between the enclosure and the wall member for defining together with the wall member and enclosure, a sound radiation component for guiding an acoustic wave radiated from the speaker unit out to a free space, so that the speaker system has 20% or more lower f0 than in the case where acoustic waves are directly radiated to the free space with the speaker unit mounted in an enclosure of the same shape as the speaker unit.

In a preferred embodiment, the wall member has an acoustic load section in a portion thereof opposed to the speaker unit.

In a preferred embodiment, the sound radiation component has a front cavity defined in a fashion corresponding to a peripheral portion of the speaker unit and a port for guiding an acoustic wave radiated from the speaker unit to the free space, wherein the port has a width in an intermediate portion thereof which is smaller than those of a connection between the front cavity and the port and of an outlet portion thereof and has a planar shape that is asymmetrical with respect to the axis of the port in an acoustic wave guide-out direction.

In a preferred embodiment, a line defining the planar shape of the port is configured by a continuous curve. Alternately, the line defining the planar shape of the port includes at least a straight portion.

According to another aspect of the present invention, a speaker system comprises: a speaker unit mounted in an enclosure; a wall member opposed to the speaker unit at a predetermined distance; and an intermediate member provided between the enclosure and the wall member for defining together with the wall member and enclosure, a sound radiation component for guiding an acoustic wave radiated from the speaker unit out to a free space, wherein at least part of the portion of the intermediate member defining the sound radiation component is comprised of a material having a pressure absorbing characteristic.

According to another aspect of the present invention, a speaker system comprises: a first speaker unit mounted in a first enclosure; a second speaker unit mounted in a second enclosure; and an intermediate member disposed between the first and second enclosures in such a manner that the first and second speaker units are opposed to each other at a predetermined distance, the intermediate member defining together with the first and second enclosures, a sound radiation component for guiding acoustic waves radiated from the first and second speaker units out to a free space, wherein at least part of the portion of the intermediate member defining the sound radiation component is comprised of a material having a pressure absorbing characteristic.

In a preferred embodiment, the material having the pressure absorbing characteristic is a polyurethane foam.

In a preferred embodiment, the polyurethane foam has an expansion ratio between 2 and 80.

In a preferred embodiment, the sound radiation component has a pressure adjustment section provided in at least part of a wall surface thereof.

In a preferred embodiment, the pressure adjustment section is comprised of a surface-treated acoustic material.

In a preferred embodiment, the surface-treated acoustic material is a felt.

In a preferred embodiment, the sound radiation component has a front cavity defined in a fashion corresponding to a peripheral portion of the speaker unit and a port for guiding an acoustic wave radiated from the speaker unit to the free space, and the port has a width in an intermediate portion thereof which is smaller than that of a connection between the front cavity and the port.

In a preferred embodiment, the outlet portion of the port is 1/20 to 1/10 of a diaphragm in the speaker unit in area.

In a preferred embodiment, the wall member has an acoustic load section in a portion thereof opposed to the speaker unit.

In a preferred embodiment, the material having the pressure absorbing characteristic is partly disposed inside the intermediate portion, and an air portion is defined between the material and an inner wall member of the intermediate member.

DETAILED DESCRIPTION OF THE INVENTION (Embodiment 1)

Figure 1:
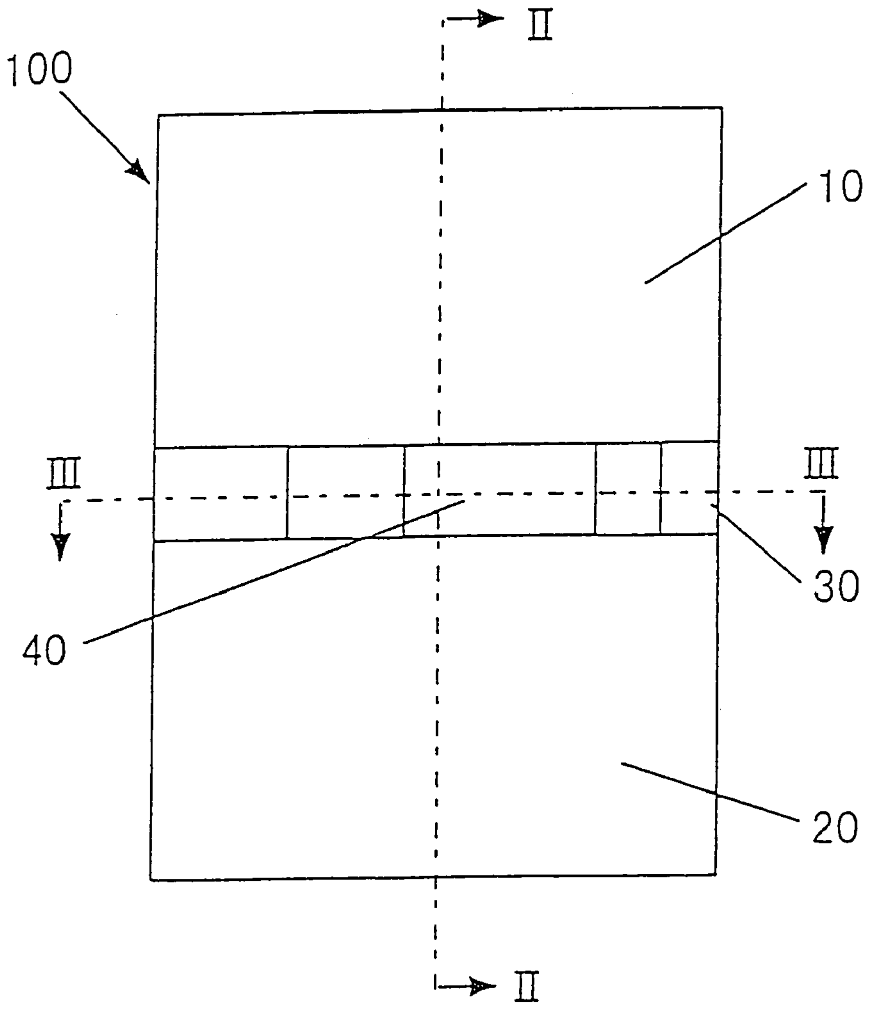
FIG. 1 is a front view of a speaker system according to an embodiment of the present invention.
Figure 2:
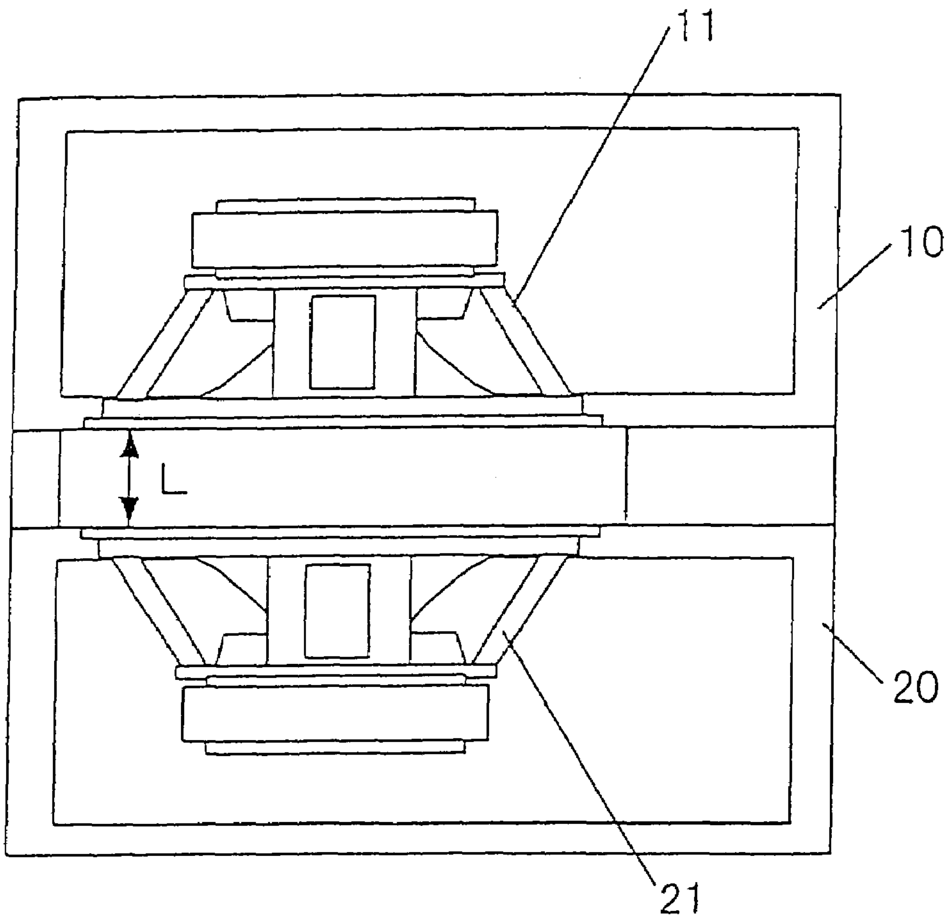
FIG. 2 is a sectional view of the speaker system in FIG. 1 taken along a line II—II therein.
Figure 3:
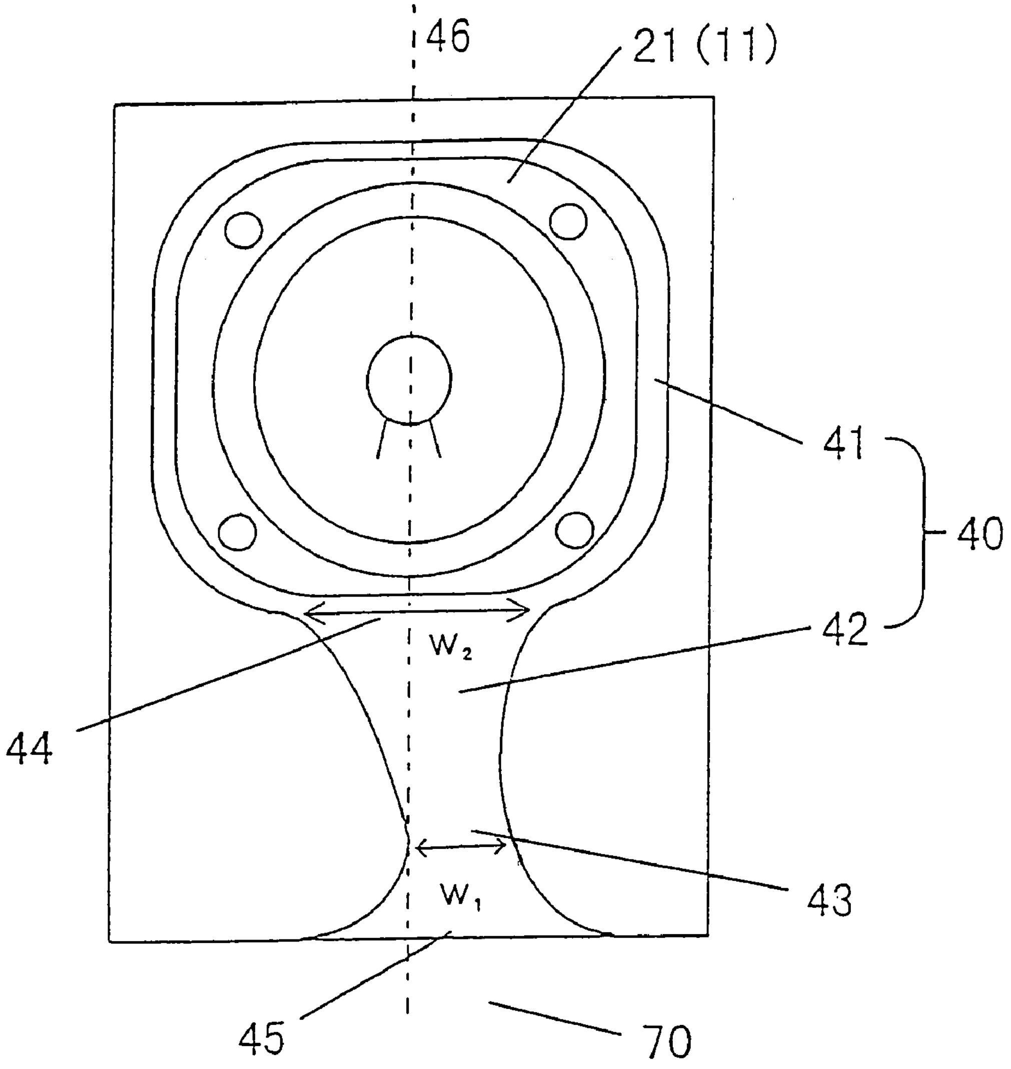
FIG. 3 is a sectional view of the speaker system in FIG. 1 taken along a line III—III therein.

An embodiment of the present invention will be described with reference to FIGS. 1 to 3. FIG. 1 is a front view of a speaker system according to the embodiment of the present invention. FIG. 2 is a sectional view of the speaker system in FIG. 1 taken along line II—II therein. FIG. 3 is a sectional view of the speaker system in FIG. 1 taken along a line III—III therein.

This speaker system 100 has an enclosure 10 with a speaker unit 11 mounted therein, an enclosure 20 with a speaker unit 21 mounted therein, and an intermediate member 30. The enclosures 10 and 20 are assembled via the intermediate member 30 in such a manner that the speaker units 11 and 21 are opposed to each other.

The speaker units 11 and 21 are opposed to each other at a predetermined distance L. The distance L defines the height (thickness) of the intermediate member 30 and can vary with the dimensions of the speaker units or the like. For example, in the case where speaker units with a diameter of 10 cm are opposite to each other, a preferable range of the distance L is between 2 and 36 mm and its optimum value is about 18 mm. If the distance L is smaller than this range, the speaker units may come in contact with each other. If the distance L is larger than this range, the decrease in f0 (that is, widening of a bass reproduction band) may be insufficient.

The speaker units 11 and 21 may be constructed according to an identical specification or different specifications. An operation method for the speaker units 11 and 21 is not particularly limited, and uses, for example, a configuration in which a monaural acoustic signal input, a lowpass filter, and an amplifier are connected in series with two speaker units connected in parallel with the amplifier. Such a configuration restrains phase shifts in signals to reduce cancellation of pressure induced by phase-interference during air compression and expansion.

The intermediate member 30 defines a sound radiation component 40 together with the enclosures 10 and 20. The sound radiation component 40 guides acoustic waves radiated from the speaker units 11 and 21 out to a free space 70 (that is, a space in which a listener is present). The sound radiation component 40 is shaped to cause a much larger degree of air compression and expansion than in the case where acoustic waves are directly radiated to the free space with the speaker unit mounted in the enclosure of the same shape as the enclosure 10 or 20, and to effectively guide the very large degree of air compression and expansion out to the free space, thereby contributing to widening the bass reproduction band.

Next, the sound radiation component 40 will be explained in detail. For simplicity, the planar shape of the sound radiation component 40 is described with reference to FIG. 3, but of course the sound radiation component 40 is three-dimensionally defined by the enclosures 10 and 20 and the intermediate member 30 in a fashion corresponding to the planar shape in FIG. 3.

The sound radiation component 40 has a front cavity 41 of the speaker unit and a port 42. The front cavity 41 is defined so as to surround the speaker unit 11 (and 21). According to this embodiment, principally the front cavity 41 serves to cause a much larger degree of air compression and expansion than in the case where acoustic waves are directly radiated to the free space with the speaker units mounted in enclosures of the same shape. Sound waves radiated from the speaker units 11 and 21 propagate to the port 42 via the front cavity 41. The port 42 guides these acoustic waves out to the free space 70.

According to this embodiment, chiefly the port 42 effectively radiates a large degree of expansion and compression generated in the front cavity 41 to the free space 70, thereby contributing to widening the bass reproduction band. A specific shape of the port 42 which can meet this requirement is as follows: (1) The port has a width in an intermediate portion 43 thereof which is smaller than those of a connection 44 between the front cavity 41 and the port 42, and those of an outlet portion 45 thereof, and (2) is asymmetrical with respect to the axis 46 of the port 42 in an acoustic wave guide-out direction. The requirements (1) and (2) are necessary and sufficient conditions, but typically, the ratio of the width $W_1$ of the intermediate portion 43 (the narrowest portion) to the width $W_2$ of the outlet portion 45, that is, $(W_2/W_1)\times 100$ is between 120 and 180% and preferably about 150%.

If the port 42 of such a shape is used to propagate acoustic waves, the substantial length of the port cannot be explicitly determined due to the above factor (1), whereby the intensity of the fundamental resonance of standing waves, which is determined by the length of the port 42, can be reduced. Thus, the level of high-order standing waves can be reduced. Further, since acoustic waves propagate at different speeds along a wall surface of the port 42 due to the above factor (2), acoustic masses moving integrally within the port are small. Consequently, energy loss is small which may occur during vibration of the acoustic masses within the sound radiation component 40 if the sound pressure varies significantly within the sound radiation component 40. As a result, air existing near the outlet portion of the sound radiation component 40, which acts as a medium, is radiated in a large volume as an air mass rather than as vibration of the medium. This is not observed in general measurements such as sine wave sweep or the like, but it is observed on application of a transition sound from a bass, drum or the like contained in a music signal and having a large energy, or of a corresponding measuring signal. In this manner, the speaker system according to the present embodiment has a function for augmenting a band of about 50 Hz or less to contribute to improving the voluminosity of the bass range.

The speaker system according to the present embodiment has 20% or more and preferably 30% or more smaller f0 than in the case where acoustic waves are directly radiated to the free space with the speaker unit 11 or 21 mounted in an enclosure of the same shape. The larger the f0 decrease rate is, the more preferable the results are, but a practical maximum f0 decrease rate is about 50%.

Figure 4:
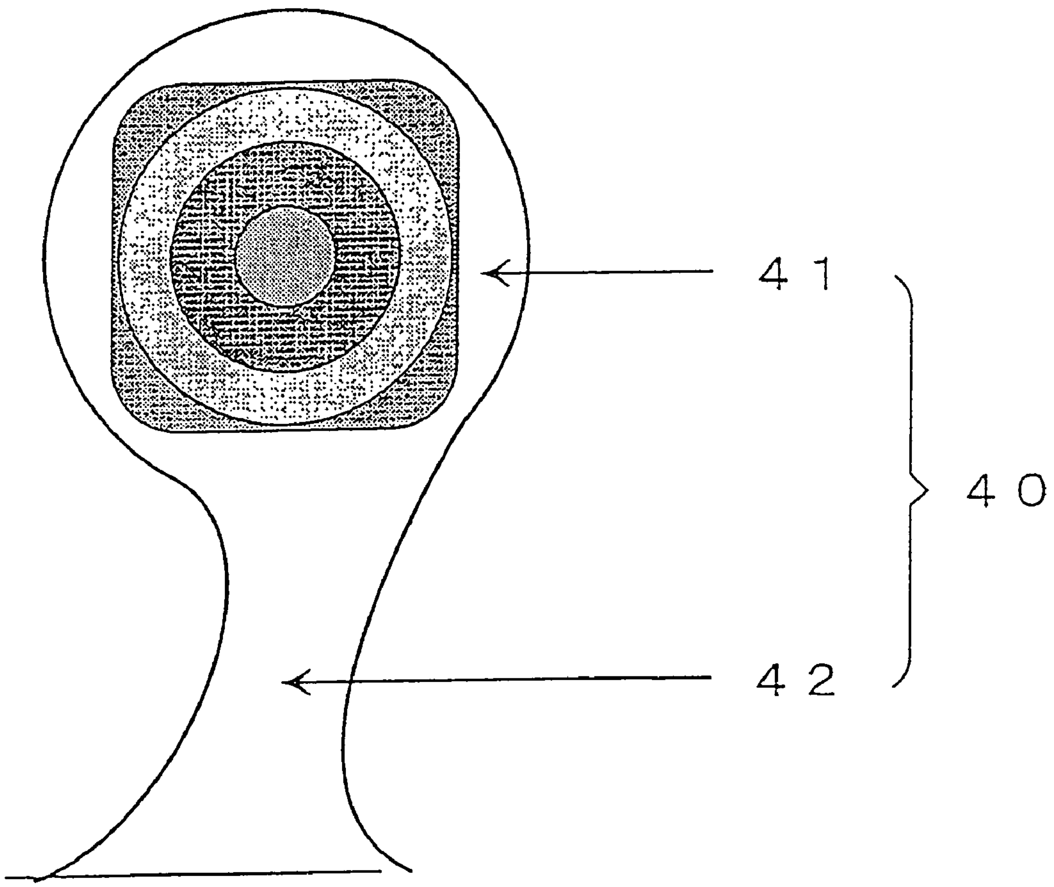
FIG. 4 is a schematic drawing for illustrating a modified example of a sound radiation component in FIG. 3.
Figure 5:
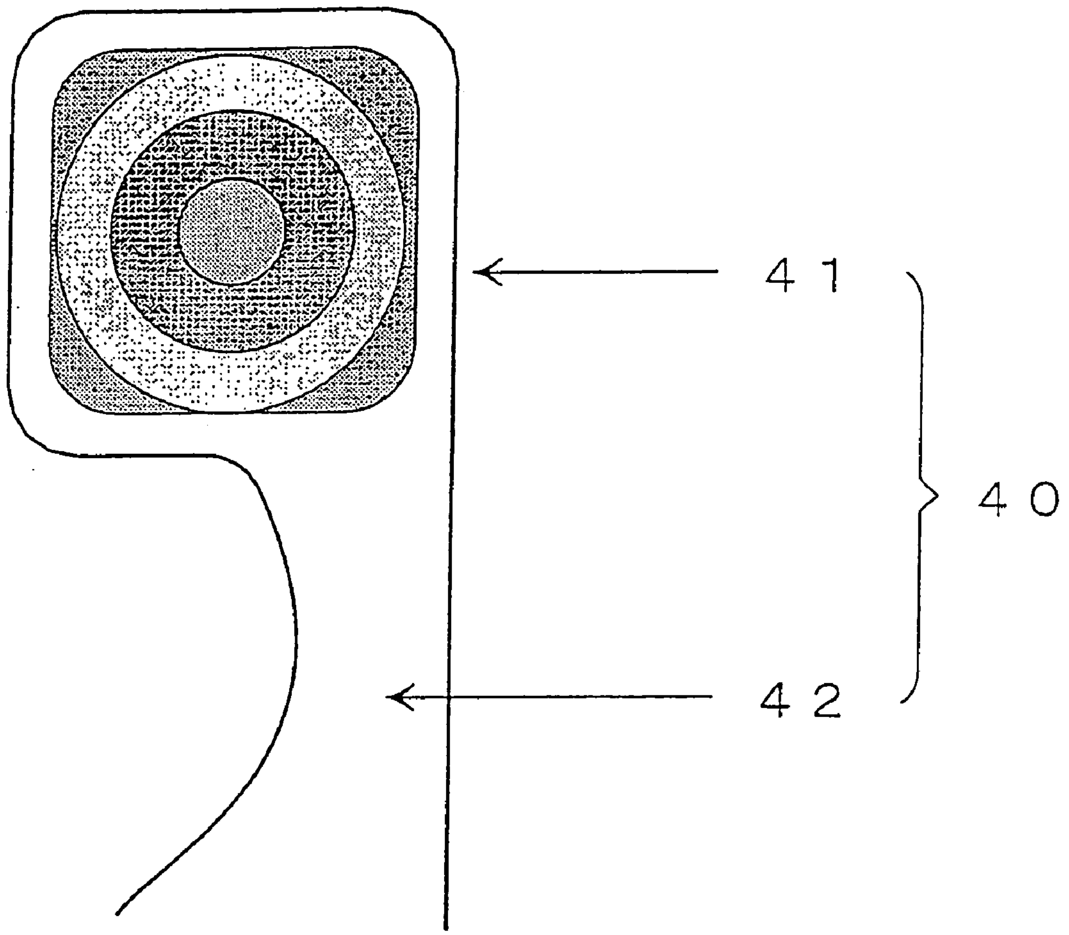
FIG. 5 is a schematic drawing for illustrating another modification of the sound radiation component in FIG. 3.

Another specific example of the sound radiation component 40 which meets the requirements (1) and (2) are shown in FIG. 4 or 5. A line defining the port 42 (that is, the wall surface of the port as seen from the top) may be comprised only of a continuous curve as shown in FIG. 4 or may include a straight portion as shown in FIG. 5. Of course, the sound radiation component 40 may have an arbitrary appropriate planar shape as long as the requirements (1) and (2) are met.

Furthermore, the sound radiation component 40 meeting the requirements (1) and (2) prevent occurrence of wind noise and degradation of the sound quality.

(Embodiment 2)

Figure 6:
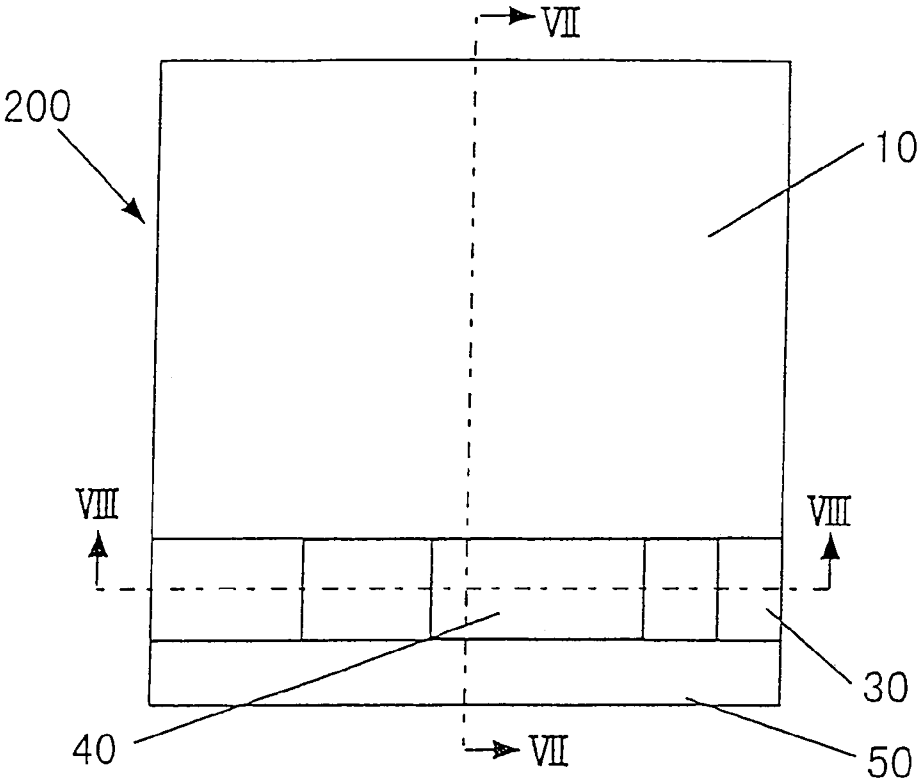
FIG. 6 is a front view of a speaker system according to another embodiment of the present invention.
Figure 7:
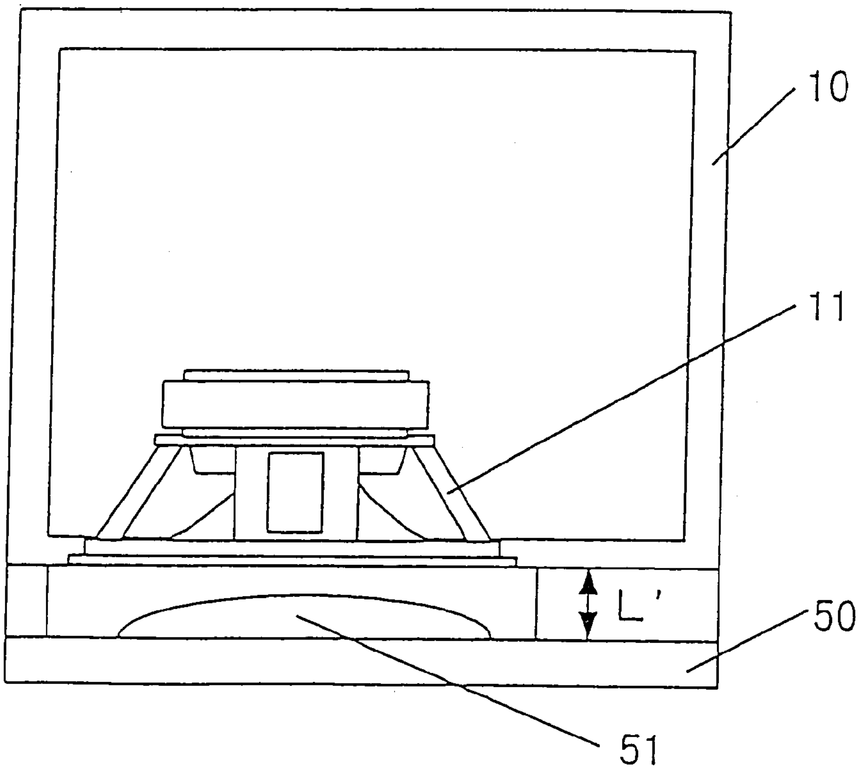
FIG. 7 is a sectional view of the speaker system in FIG. 6 taken along a line VII—VII therein.
Figure 8:
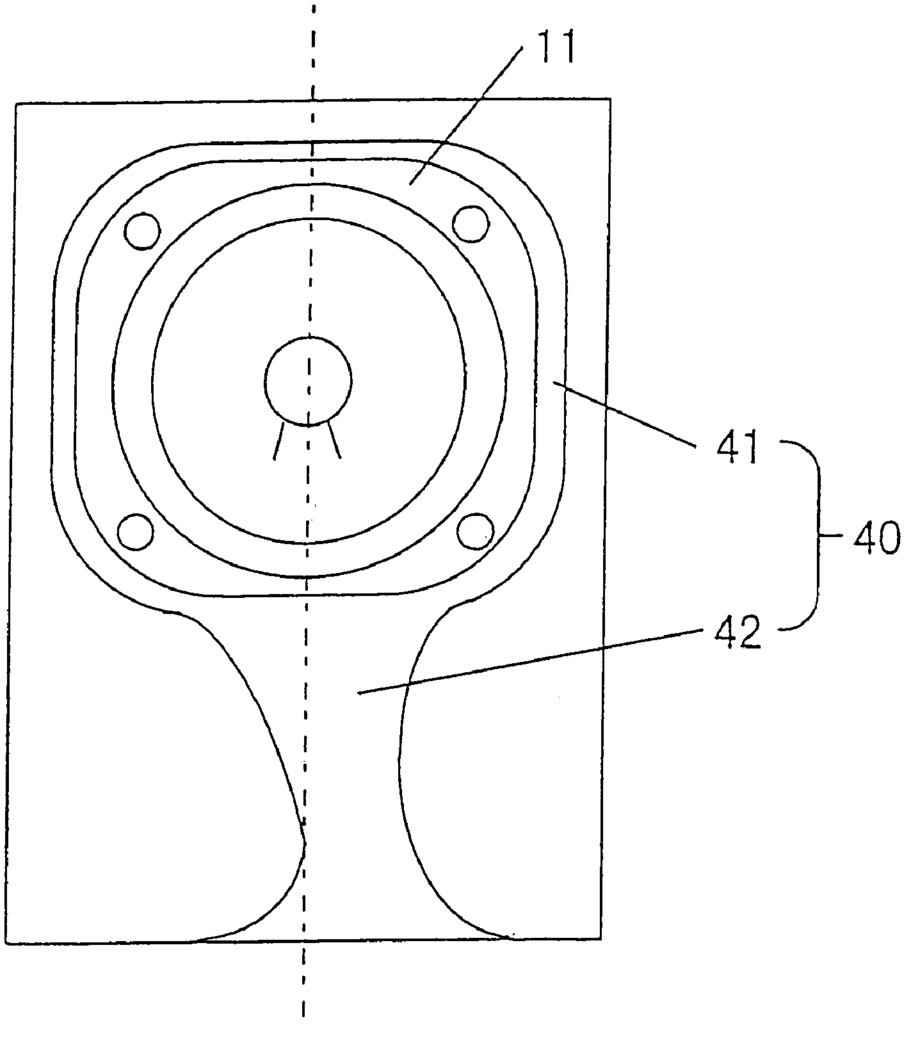
FIG. 8 is a sectional view of the speaker system in FIG. 6 taken along a line VIII—VIII therein.

Another embodiment of the present invention will be described with reference to FIGS. 6 to 8. FIG. 6 is a front view of a speaker system according to this embodiment of the present invention. FIG. 7 is a sectional view of the speaker system in FIG. 6 taken along line VII—VII therein. FIG. 8 is a sectional view of the speaker system in FIG. 6 taken along line VIII—VIII therein. According to this embodiment, instead of opposing the two speaker units to each other, a speaker unit and a wall member having an acoustic load section are opposed to each other. Members having the same functions as in Embodiment 1 are represented by the same reference numerals, and detailed description thereof is omitted.

A speaker system 200 has a enclosure 10 with a speaker unit 11 mounted therein, a wall member 50 with an acoustic load section 51 provided thereon, and an intermediate member 30. The enclosure 10 and the wall member 50 are assembled via the intermediate member 30 in such a manner that the speaker unit and a maximum projecting portion of the acoustic load section 51 are opposed to each other at a predetermined distance L'.

The distance L' can vary as appropriate depending on the dimensions of the speaker units or the like. For example, if the speaker unit has a diameter of 13 cm, a preferable range of the distance L' is between 2 and 36 mm and its optimum value is about 18 mm. If the distance L' is smaller than this range, the speaker unit may come in contact with the acoustic load section. If the distance L' is larger than this range, the decrease in f0 (that is, widening of the bass reproduction band) may be insufficient.

The wall member 50 has an acoustic load section 51 in a portion thereof opposed to the speaker unit 11. An arbitrary appropriate acoustic load section 51 can be employed as long as the sound radiation component 40 can cause a much larger degree of air compression and expansion than in the case where acoustic waves are directly radiated to the free space with the speaker unit mounted in an enclosure of the same shape. In FIG. 7, the acoustic load section 51 is a bowl-shaped projection.

Figure 9:
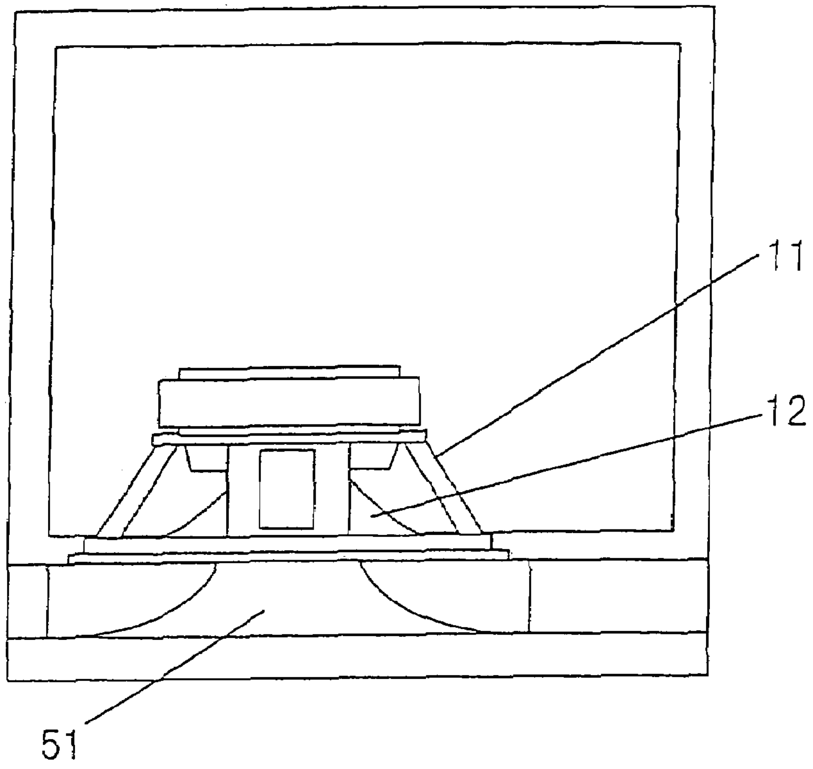
FIG. 9 is a schematic drawing for illustrating a modified example of an acoustic load section, which is in FIG. 7.
Figure 10:
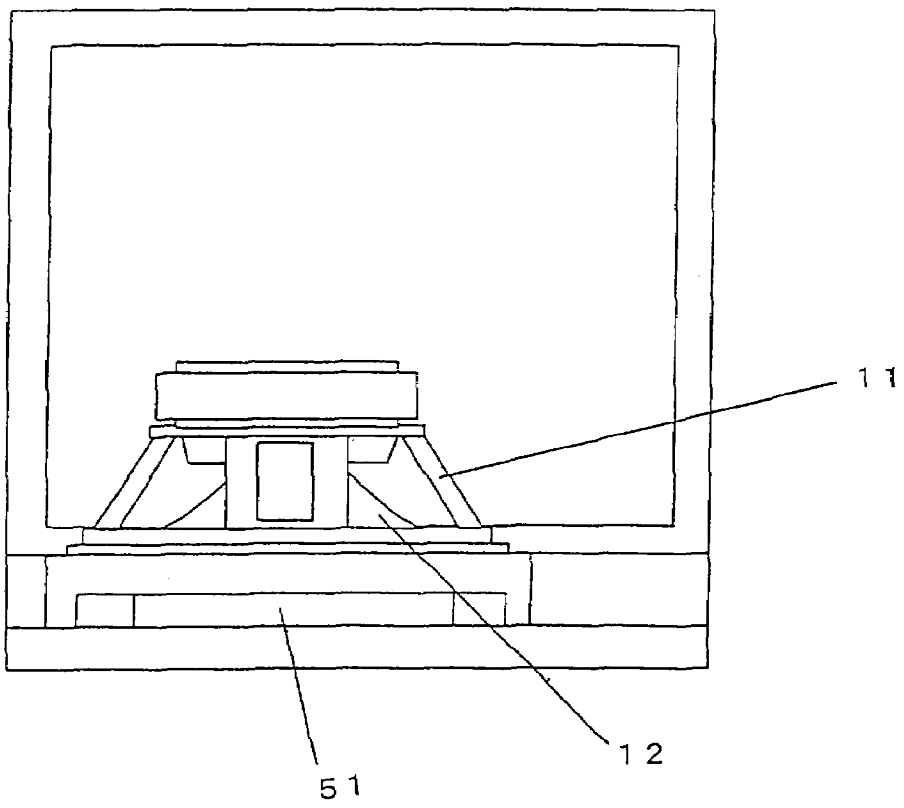
FIG. 10 is a schematic drawing for illustrating another modified example of the acoustic load section in FIG. 7.
Figure 11:
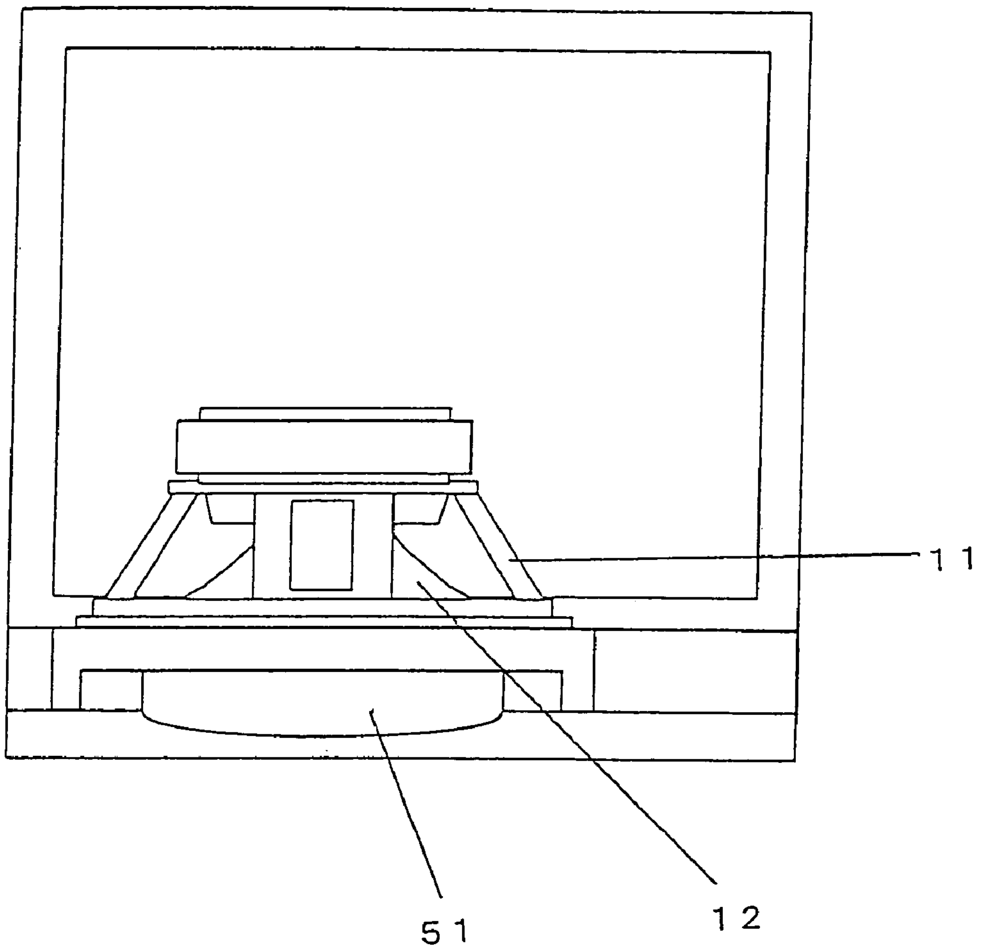
FIG. 11 is a schematic drawing for illustrating yet another modified example of the acoustic load section in FIG. 7.

Alternately, the acoustic load section 51 may be a projection having a trapezoidal cross section as forms an even gap from a diaphragm 12 in the speaker unit 11 as shown in FIG. 9, or a ring-shaped projection having a predetermined height and width as shown in FIG. 10 (for example, in a 13-cm unit, a height of 10 mm and a ring width of 15 mm) or a combination of a ring-shaped projection and a bowl-shaped recess as shown in FIG. 11. An acoustic load section having a projection and a recess as shown in FIGS. 10 and 11 provides a more significant effect on f0 reduction (that is, the effect of widening the bass reproduction band) than a simply projecting acoustic load section such as those shown in FIGS. 7 and 9.

(Embodiment 3)

Figure 12:
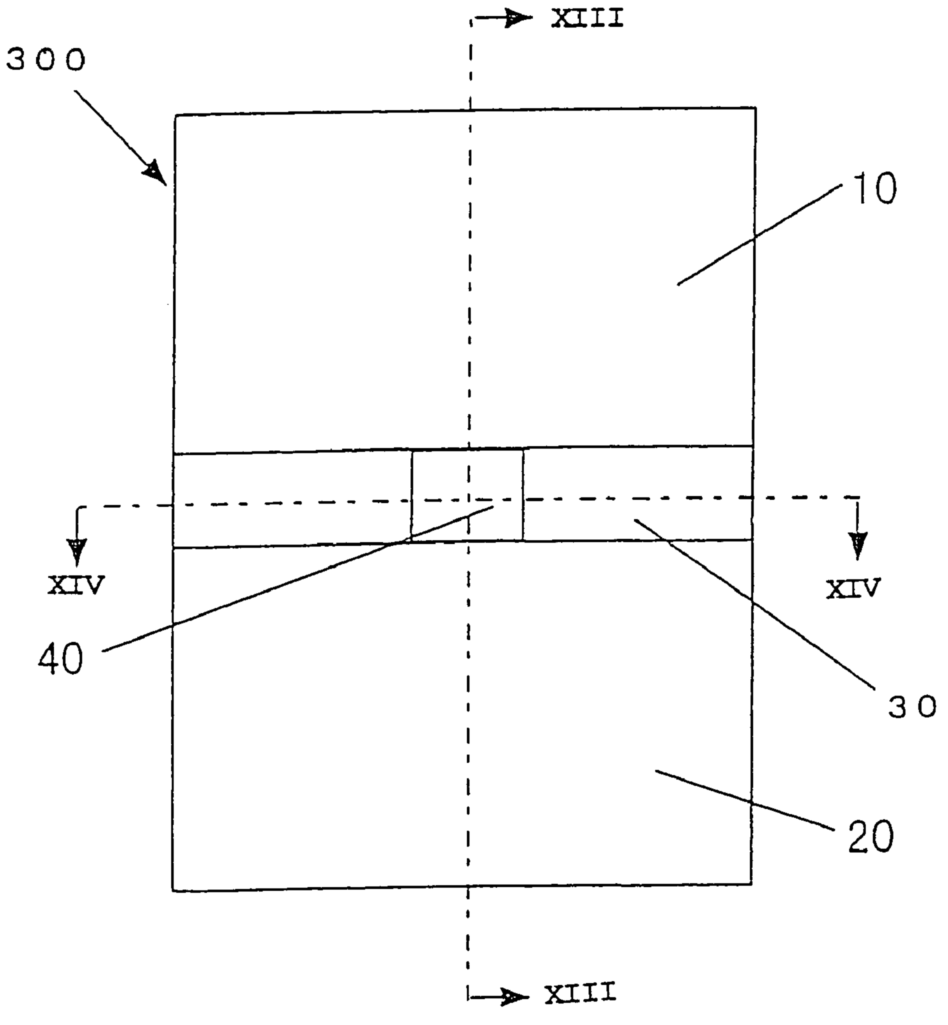
FIG. 12 is a front view of a speaker system according to yet another embodiment of the present invention.
Figure 13:
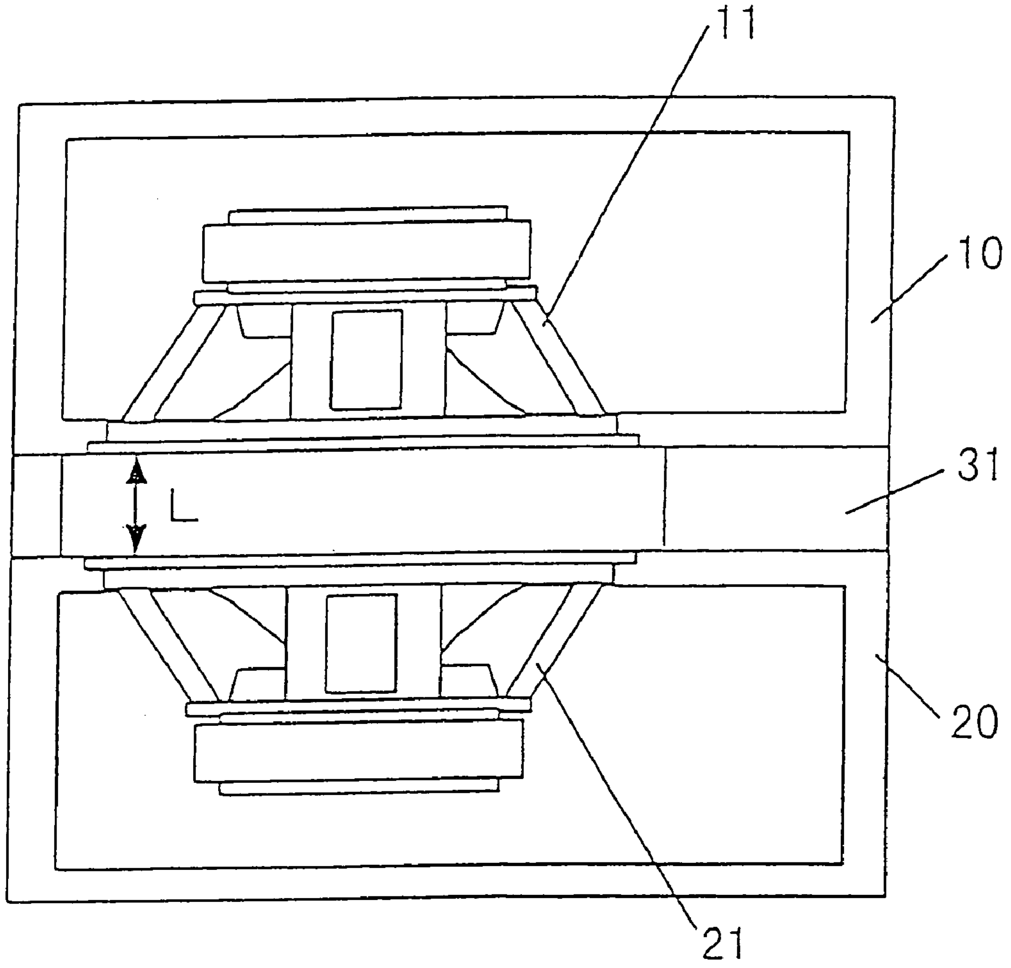
FIG. 13 is a sectional view of the speaker system in FIG. 12 taken along a line XIII—XIII therein.
Figure 14:
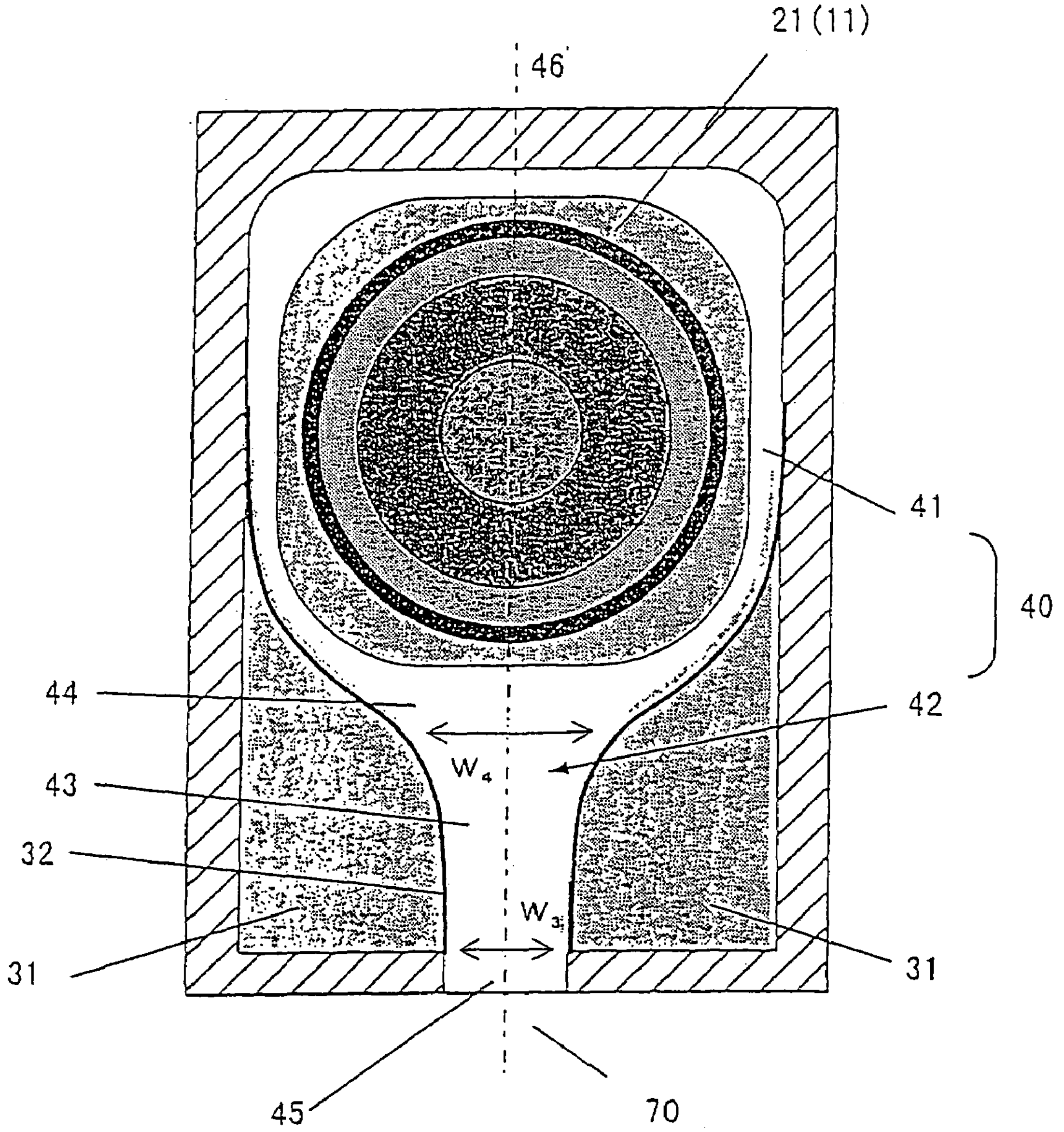
FIG. 14 is a sectional view of the speaker system in FIG. 12 taken along a line XIV—XIV therein.
Figure 15:
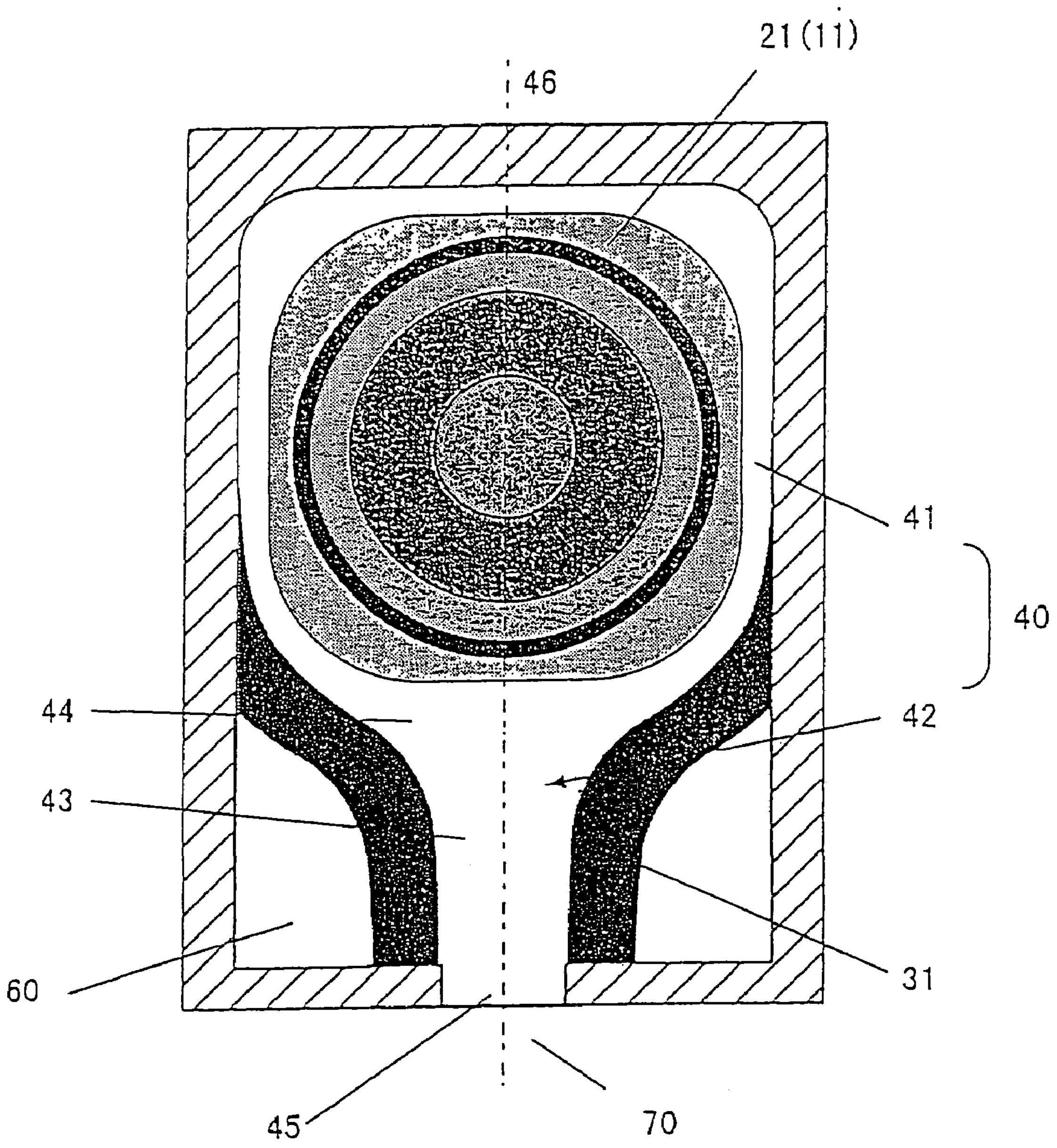
FIG. 15 is a schematic drawing for illustrating a modified example of the speaker system in FIG. 14.

Referring to FIGS. 12 to 15, another embodiment of the present invention will be explained. FIG. 12 is a front view of a speaker system according to this embodiment of the present invention. FIG. 13 is a sectional view of the speaker system in FIG. 12 taken along line XIII—XIII therein. FIG. 14 is a sectional view of the speaker system in FIG. 12 taken along line XIV—XIV therein. FIG. 15 is a schematic drawing for illustrating a modified example of the speaker system in FIG. 14. Members having the same functions as in Embodiment 1 or 2 are represented by the same reference numerals, and description thereof is omitted.

This speaker system 300 has an enclosure 10 with a speaker unit 11 mounted therein, an enclosure 20 with a speaker unit 21 mounted therein, and an intermediate member 30. The enclosures 10 and 20 are assembled via the intermediate member 30 in such a manner that the speaker units 11 and 21 are opposed to each other.

At least part of a portion of the intermediate member 30 which defines a sound radiation component 40 (this portion is hereafter referred to as a "defining portion 31") is comprised of a material having a pressure absorbing characteristic (pressure absorbing material). The expression "part of the defining portion 31 is composed of a pressure absorbing material" means that the pressure absorbing material is provided on at least part of a wall surface of the intermediate portion which defines the sound radiation component 40. For example, (i) the defining portion 31 may be constructed integrally with the intermediate member 30, using a rigid material, and the pressure absorbing material may then be stuck to a surface of the rigid defining portion at a predetermined position thereof. Alternatively, (ii) the defining portion may be constructed using the pressure-absorbing material (that is, the pressure absorbing material can be filled entirely or partly in the intermediate member 30 so that the pressure absorbing material itself forms the defining portion 31. FIG. 14 illustrates a case where the pressure absorbing material is filled in the entire internal portion of the intermediate material, while FIG. 15 illustrates a case where the pressure absorbing material is disposed inside the intermediate member at a predetermined position (that is, an air portion 60 is provided between an inner wall of the intermediate member and the defining portion).

The disposition position and thickness of the pressure absorbing material can vary with the purpose. As described above, the pressure absorbing material may be thick enough to be filled in the entire internal portion of the intermediate portion or may be thin enough to be stuck to the defining portion comprised of a rigid material. Specifically, the pressure absorbing material is between 1 and 100 mm in thickness. The pressure absorbing material may be disposed only in an area corresponding to the port 42 or in an area corresponding to a portion extending from the front cavity 41 to the port 42. By selecting an appropriate disposition position and thickness for the pressure absorbing material, the bass reproduction capability, output characteristic, noise and wind noise of the obtained speaker system can be controlled. For example, a configuration as shown in FIG. 15 (that is, a configuration in which the air portion 60 is provided between the inner wall of the intermediate member and the defining portion) can reduce noise in a band to which human ears are most sensitive (2 to 5 kHz)

The pressure absorbing material functions like a rigid material during a small input (when air flows slowly, that is, when the pressure in the sound radiation component varies insignificantly), while functioning like a soft material during a large input (when air flows fast, that is, when the pressure in the sound radiation component varies significantly). A typical pressure absorbing material includes a so called cushioning material. The pressure absorbing material need not be soundproof but may have a sound insulating capability. A typical case where the sound absorbing capability is effective in improving the sound quality is that the frequency response of a sound absorbing rate of the material is high in a band including unwanted noise (for example, wind noise). Specific examples of such a pressure absorbing material include a polyurethane foam, a rubber foam, and a polyethylene foam. The polyurethane foam is preferred. If the polyurethane foam is used, its expansion rate is preferably between 2 and 80. The use of the pressure absorbing material in the defining portion 31 prevents overpressure on a front surface portion of the speaker during a large input to provide bass with a quick response without disturbing the characteristics of the speaker. Further, if a material showing a high sound absorbing capability in a treble range is used, the occurrence of wind noise can be particularly appropriately prevented (in particular, wind noise during a large input).

Preferably, a pressure adjustment section 32 is provided on at least part of a wall surface defining the sound radiation component 40. The pressure adjustment section 32 may be provided all over the wall surface of the sound radiation component 40. The pressure adjustment section 32 may be disposed on the wall surface at an arbitrary-position depending on the purpose. For example, the pressure adjustment section 32 may be disposed all over the wall surface of the port 42, or only on part of the wall surface located on one side of the port, or on part of the wall surface extending from the front cavity 41 to the port 42. Preferably, the pressure adjustment section 32 is comprised of a surface-treated acoustic material. The surface-treated acoustic material has functions similar to those of the above described pressure absorbing material and further has a smoother surface than the pressure absorbing material. The smooth surface enables the flow resistance of air to be reduced to smooth the flow of air regardless of the magnitude of the input, thereby significantly improving the sound quality of the speaker obtained. Typical examples of the surface-treated acoustic material include a felt and a soft film. The surface-treated acoustic material need not be soundproof but may have a sound insulating capability. Typically, the pressure adjustment section 32 is disposed by sticking the surface-treated acoustic material to the defining portion 31. In addition to the above effects, the pressure adjustment section 32 substantially reduces energy loss in the bass range. This is because a combination of the pressure absorbing material (for example, a polyurethane foam) with the surface-treated material can eliminate even a minor sound absorbing capability of the pressure absorbing material exhibited in the bass range, thereby further reducing energy loss in the bass range.

Thus, the pressure absorbing material and the surface-treated acoustic material are preferably combined together as appropriate depending on the purpose.

According to this embodiment, it is sufficient that the narrowest portion of the port 42 has a smaller width than a connection 44 between the front cavity 41 and the port 42. The use of the pressure absorbing material in the defining portion 31 varies the propagation speed of acoustic waves along the wall surface of the port 42, so that the speaker system provides effects similar to those obtained if the port has an asymmetrical planar shape. Thus, the planar shape of the port may be symmetrical or asymmetrical with respect to a shaft 46 extending in an acoustic wave guide-out direction (FIG. 14 illustrates a symmetrical case). In addition, the narrowest portion of the port 42 may be an intermediate portion 43 as shown in FIG. 3 or an outlet portion 45 as shown in FIG. 14. In other words, the port 42 may have such a constricted planar shape as defining the intermediate portion 43 shown in FIG. 3, or a planar shape with a monotonously decreasing from the connection 44 to the outlet portion 45 (that is, the intermediate portion 43 is not defined), as shown in FIG. 14. The ability to define the port 42 having a planar shape with a monotonously decreasing from the connection 44 to the outlet portion 45 is one of the features of the present embodiment. This also originates from the use of the pressure absorbing material in the defining portion 31. That is, the use of the pressure absorbing material in the defining portion 31 prevents the substantial length of the port from being explicitly determined, thereby reducing the intensity of the fundamental wave resonance of standing waves, which is determined by the length of the port 42. The ratio of the width $W_3$ of the narrowest portion of the port 42 (that is, the intermediate portion 43 or putlet portion 45) to the width $W_4$ of the connection 44 $(W_4/W_3)\times100$ is between 120 and 180% and preferably about 150%.

Preferably, the volume of the port 42 is about one to two times as large as the volume displacement of a diaphragm. By forming the port 42 of a volume in such a range, the speaker system is unlikely to be affected by the nonlinearity of air and deformation of cone paper or the like caused by the sound pressure is prevented, thereby providing bass with a quick response without disturbing the characteristics of the system even during a large input.

The area of the outlet portion 45 is preferably 1/10 or less of that of the diaphragm of the speaker unit and more preferably between 1/20 and 1/10 thereof. If the area ratio is smaller than 1/20, the sound pressure may be insufficient. If the area ratio is larger than 1/10, air moves at a lower speed, thereby often hindering bass with a quick response from being obtained. This small area of the outlet portion (that is, the opening area of the speaker system), which is much smaller than that of conventional small-sized woofers, allows bass with a quick response to be obtained and is very advantageous in product design.

The speaker system according to this embodiment also has 20% or more and preferably 30% or more lower f0 than in the case where acoustic waves are directly radiated to the free space with the speaker unit 11 or 21 mounted in an enclosure of the same shape.

(Embodiment 4)

Figure 16:
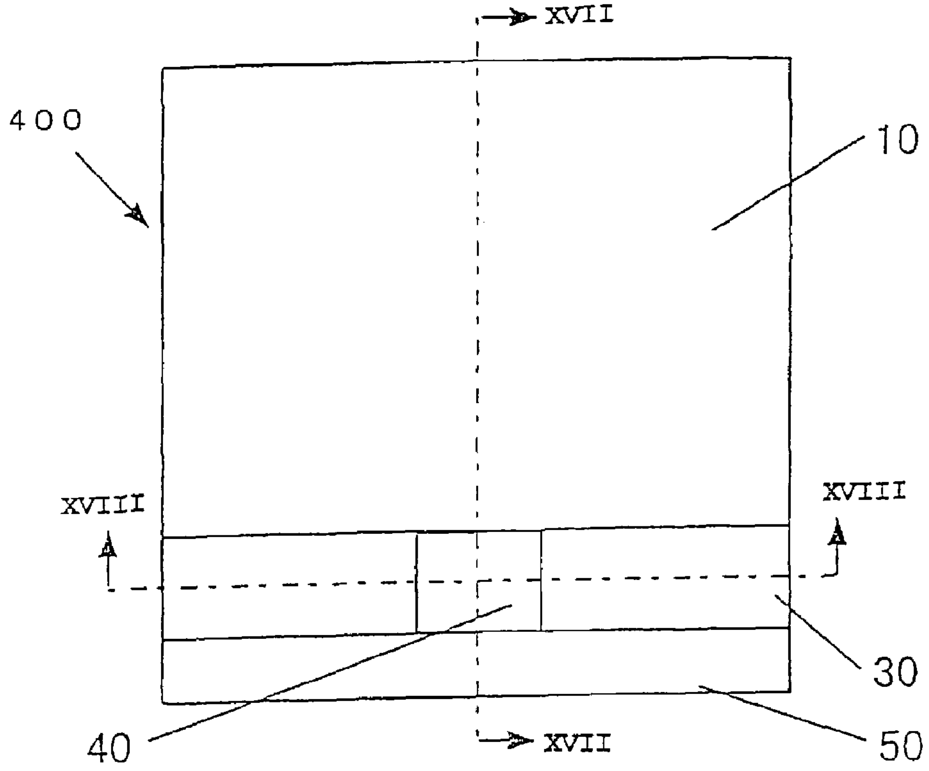
FIG. 16 is a front view of a speaker system according to still another embodiment of the present invention.
Figure 17:
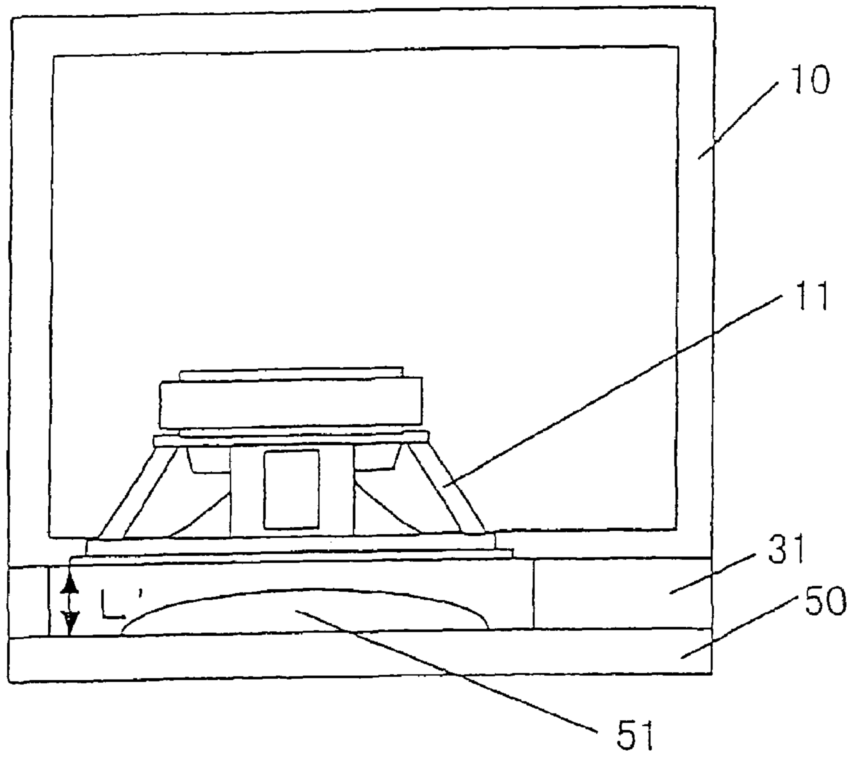
FIG. 17 is a sectional view of the speaker system in FIG. 16 taken along a line XVII—XVII therein.
Figure 18:
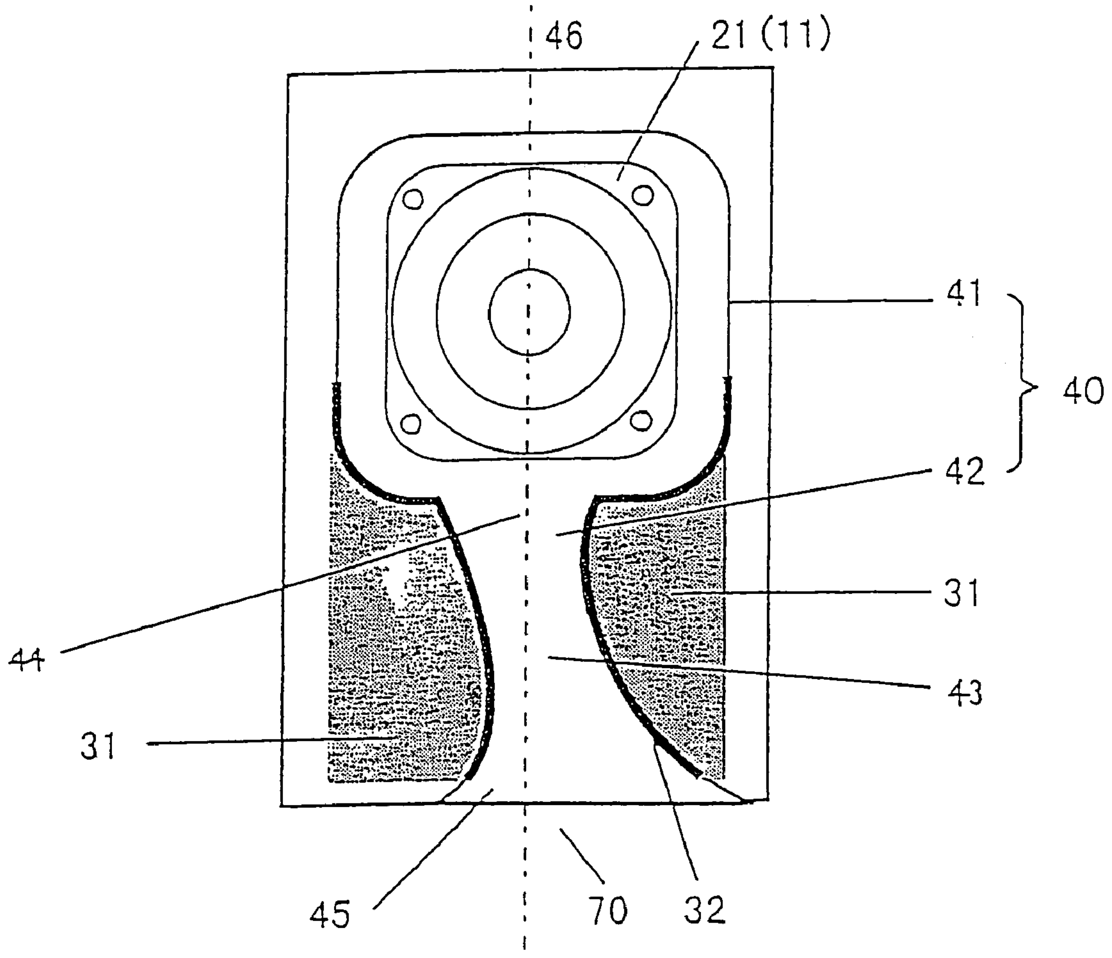
FIG. 18 is a sectional view of the speaker system in FIG. 16 taken along a line XVIII—XVIII therein.

Yet another embodiment of the present invention will be described with reference to FIGS. 16 to 18. FIG. 16 is a front view of a speaker system according to this embodiment. FIG. 17 is a sectional view of the speaker system in FIG. 16 taken along line XVII—XVII therein. FIG. 18 is a sectional view of the speaker system in FIG. 16 taken along line XVIII—XVIII therein. According to this embodiment, instead of the two speaker units opposed to each other, a speaker unit and a wall member having an acoustic load section are opposed to each other, as in Embodiment 2. This embodiment shows a case where the port 42 has an asymmetrical shape with respect to its axis in an acoustic wave guide-out direction. Members having the same functions as in Embodiments 1 to 3 are represented by the same reference numerals, and detailed description thereof is omitted.

A speaker system 400 has an enclosure 10 with a speaker unit 11 mounted therein, a wall member 50 with an acoustic load section 51 provided thereon, and an intermediate member 30. The enclosure 10 and the wall member 50 are assembled via the intermediate member 30 in such a manner that the speaker unit and a maximum projecting portion of the acoustic load section 51 are opposed to each other at a predetermined distance L'. The distance L' is as described in Embodiment 2. In addition, an arbitrary appropriate acoustic load section 51 can be employed as described in Embodiment 2 (for example, the acoustic load sections 51 shown in FIGS. 9 to 11 can be employed in addition to the one in FIG. 17).

The speaker system according to this embodiment also has 20% or more and preferably 30% or more lower f0 than in the case where acoustic waves are directly radiated to the free space with the speaker unit 11 mounted in an enclosure of the same shape.

(Embodiment 5)

According to still another embodiment of the present invention, speaker systems each having an enclosure 10 with a speaker unit 11 mounted therein, a wall member 50 with an acoustic load section 51 provided thereon, and an intermediate member 30 may be placed on each other such that the speaker units are opposed to each other (that is, the rear surfaces of the acoustic load sections 51 are opposed to each other). In this case, the acoustic load section 51 may be identical or different.

The present invention will be further specifically explained with reference to examples, but it is not limited to these examples.

EXAMPLE 1

Two 10-cm speaker units were produced in accordance with the same specification and each was mounted in a 2-liter (124 mm×217 mm×115 mm) enclosure. These enclosures were assembled via an intermediate member in such a manner that the units were opposed to each other at an interval of 18 mm, thereby producing a speaker system as shown in FIGS. 1 to 3. The intermediate member was shaped to have a sound radiation component space height of 18 mm, an outlet portion width of 60 mm, an intermediate portion (narrowest portion) width of 40 mm, and a port length of 50 mm. Next, the speaker system was actually operated, and its fIIp was measured.

On the other hand, the speaker unit mounted in the enclosure was operated alone, and its f0 was measured.

As a result, the speaker system according to the present invention had f0 of 62 Hz, and the units alone had f0 of 90 Hz. This result showed that the speaker system according to the present invention has about 31% lower f0 than the units alone.

Further, the speaker system was produced in the same manner as described above except that the sound radiation components each had a space height of 36 or 54 mm, and its f0 was measured. As a result, the 36-mm speaker system had f0 of 72 Hz (about 20% lower than that of the units alone), while the 54-mm speaker system had f0 of 78 Hz (about 13% lower than that of the units alone). These results indicate that the units are preferably located as close to each other as possible without being contacted with each other.

EXAMPLE 2

A 13-cm speaker unit was produced and mounted in a 3-liter closed box (150 mm×210 mm×150 mm). The closed box and a wall member were assembled via an intermediate member in such a manner that the unit was opposed to the wall member at an interval of 18 mm, thereby producing a speaker system as shown in FIGS. 6 to 8. The intermediate member was shaped to have a sound radiation component space height of 18 mm, an outlet portion width of 90 mm an intermediate portion (narrowest portion) width of 60 mm, and a port length of 75 mm. Next, the speaker system was actually operated, and its f0 was measured.

On the other hand, the speaker unit mounted in the closed box was operated alone, and its f0 was measured.

As a result, the speaker system according to the present invention had f0 of 95 Hz, and the unit alone had f0 of 126 Hz. This result showed that the speaker system according to the present invention has about 25% lower f0 than the units alone.

EXAMPLE 3

A speaker system with an acoustic load section as shown in FIG. 9 was produced in the same manner as in Example 2 and subjected to tests similar to those in Example 2. As a result, this speaker system had f0 of 92 Hz, which is about 27% lower than f0 of the unit alone.

EXAMPLE 4

A speaker system with an acoustic load section as shown in FIG. 10 was produced in the same manner as in Example 2 and subjected to tests similar to those in Example 2. As a result, this speaker system had f0 of 84 Hz, which is about 33% lower than f0 of the unit alone.

EXAMPLE 5

Figure 19:
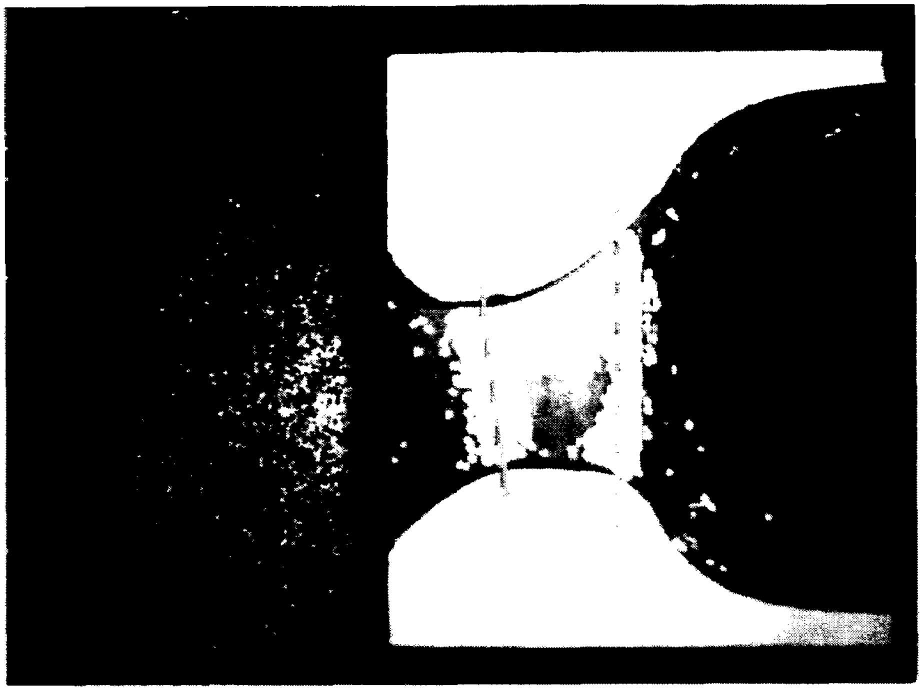
FIG. 19 is a photograph showing results of observation of the behavior of air of a sound radiation component used in the present invention.

The behavior of air of the sound radiation component (for example, the sound radiation component shown in FIG. 3) for use in the speaker system according to the present invention was compared with the behavior of air of a conventional acoustic tube. Specifically, a plate was attached to the enclosure with the unit produced in Example 1, via the intermediate member used in Example 1, thereby forming a sound radiation component similar to that in Example 1. Fine powders were spread all over the sound radiation component, and the units were driven with a low-frequency (60 Hz) sine wave and observed for movement of the powders (that is, the density of air). A photograph showing a result of the observation is shown in FIG. 19.

Figure 20:
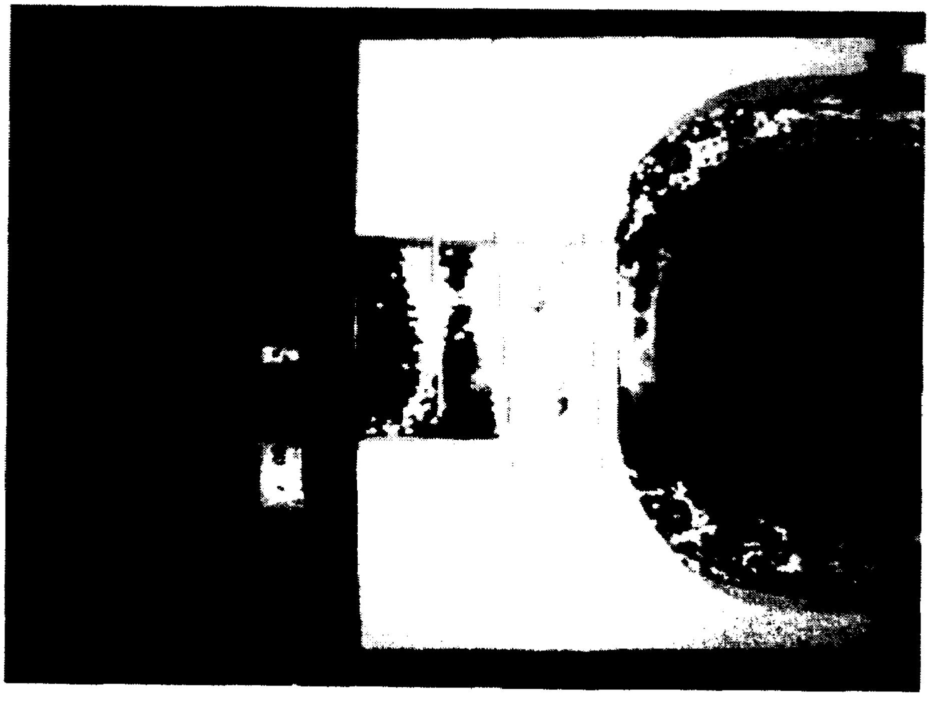
Fig. 20 PRIOR ART
FIG. 20 is a photograph showing results of observation of the behavior of air of a conventional speaker system.
Figure 21:
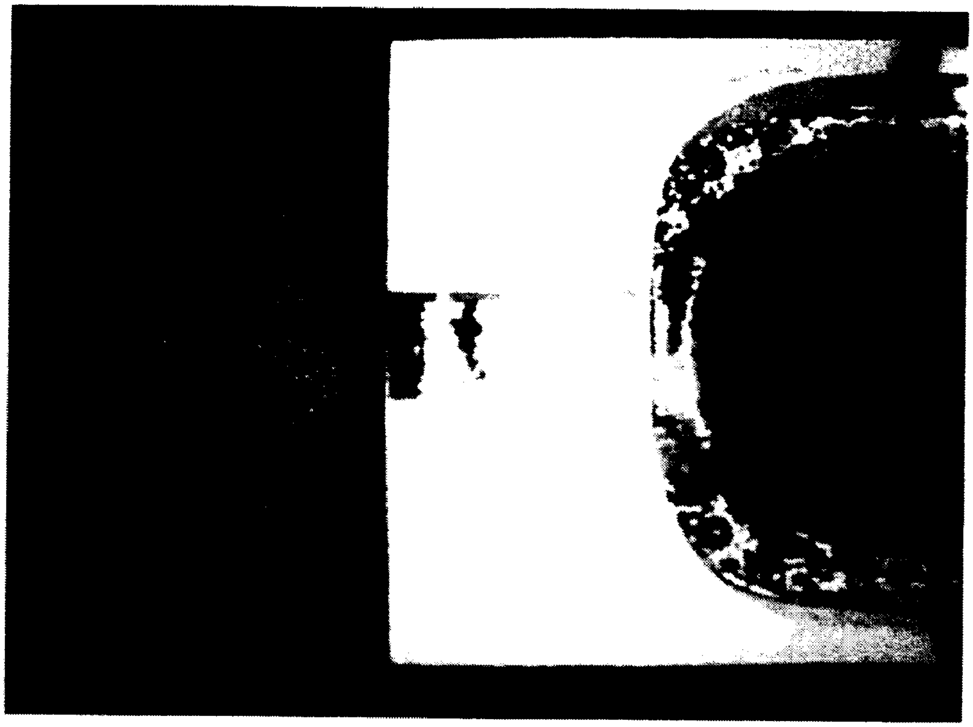
Fig. 21 PRIOR ART
FIG. 21 is a photograph showing results of observation of the behavior of air of the conventional speaker system.

On the other hand, acoustic tubes having rectangular section (that is, a rectangular parallelpiped; formed of rigid material; width of 40 mm and 20 mm) were each subjected to similar tests. A photograph showing a result of the observation is shown in FIGS. 20 and 21.

Figure 22:
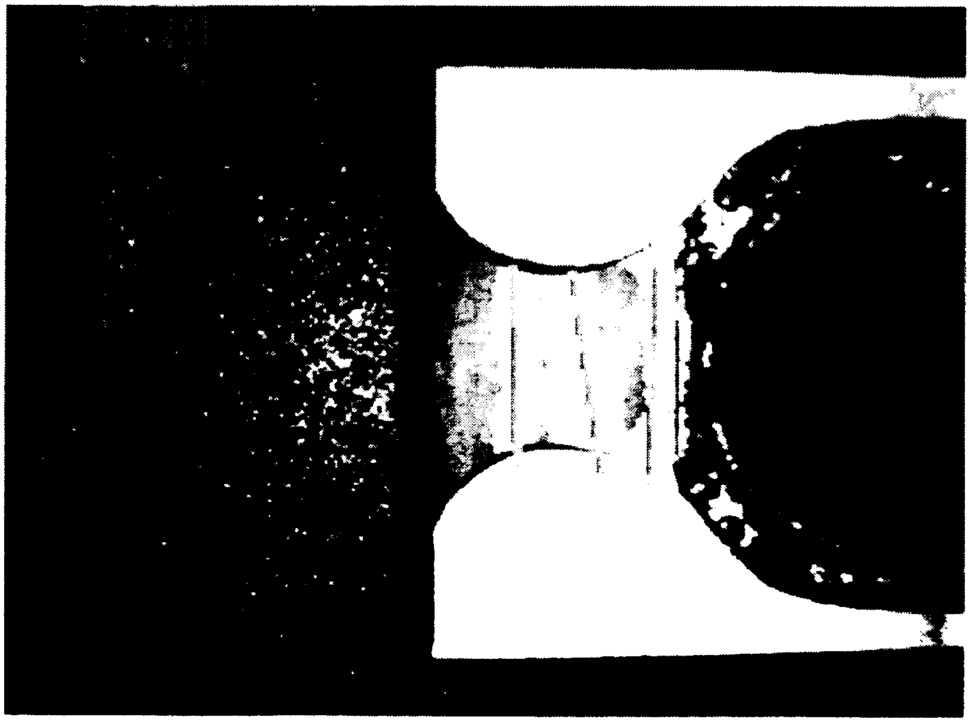
Fig. 22 PRIOR ART
FIG. 22 is a photograph showing results of observation of the behavior of air of the conventional speaker system.

Furthermore, a conventional acoustic tube with a narrow intermediate portion was subjected to similar tests. A photograph showing a result of the observation is shown in FIG. 22.

As is apparent from comparison among FIGS. 19 to 22, the number of stripes (knots) formed by the moving powders in the sound radiation component used in the present invention is smaller than the number of stripes (knots) formed in the conventional acoustic tube. Further, the sound radiation component used in the present invention involves a wide range of powder movement in the outlet portion. As a result, the sound radiation component used in the present invention enables air to be radiated as a larger mass using a larger force, thereby widening the bass reproduction band.

EXAMPLE 6

Figure 23:
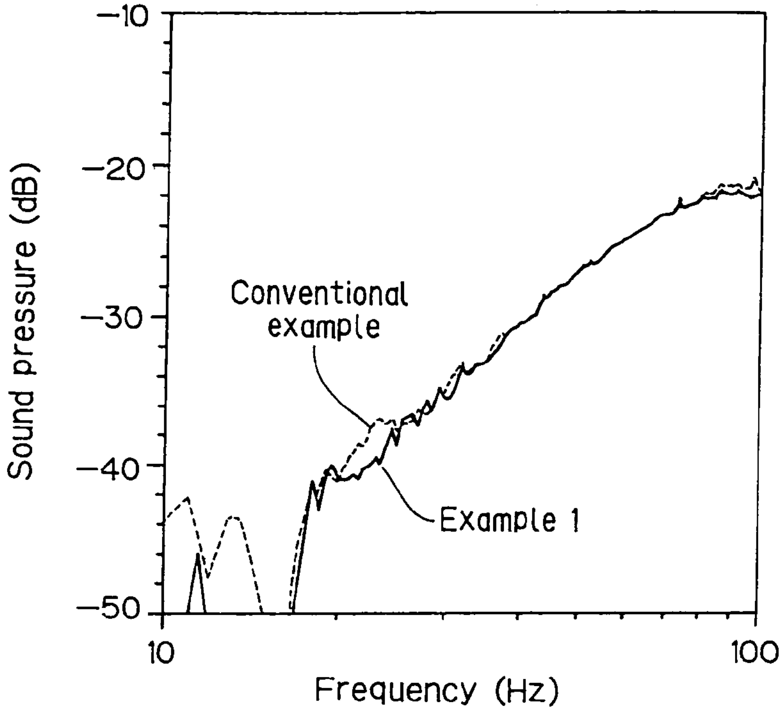
FIG. 23 is a graph for comparing a transfer function for the sound radiation component used in the present invention with a transfer function for a port tube used in a conventional speaker system.

Ten 60-Hz sine waves (2V and 6 V) were input to the speaker system in Example 1 and a radiated sound pressure was received by a microphone so as to measure a transfer function of this system. On the other hand, a speaker system was produced in the same manner as described above except for the formation of a port such as that shown in FIG. 22, and its transfer function was measured. FIG. 23 shows results obtained when 2 V was input, while FIG. 24 shows results obtained when 6 V was input.

Figure 24:
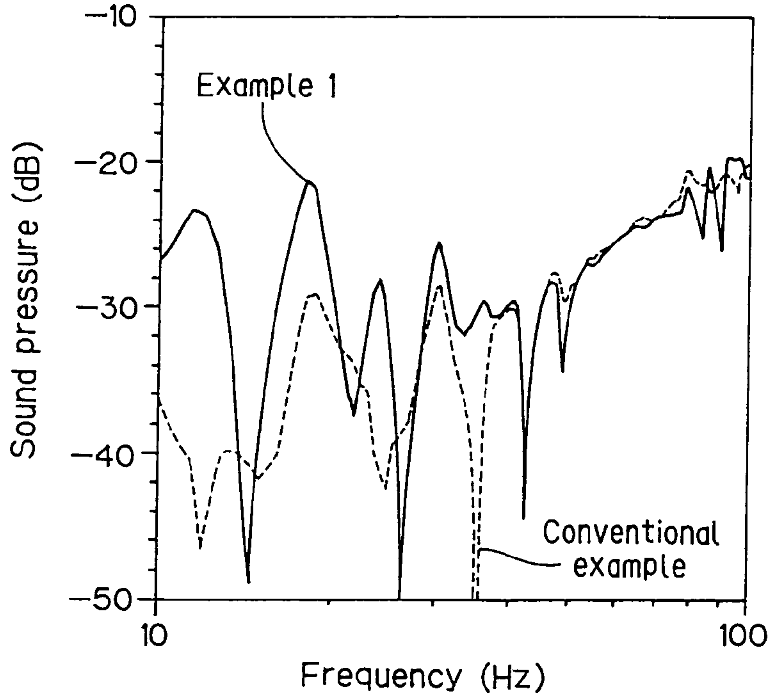
FIG. 24 is a graph for comparing the transfer function for the sound radiation component used in the present invention with the transfer function for the port tube used in the conventional speaker system.

As is apparent from FIGS. 23 and 24, no significant difference was observed between these systems when 2 V was input, whereas, when 6 V was input, significant variations in pressure were observed in a portion located before a diaphragm in the speaker system of Example 1. This indicates that the speaker system according to Example 1 enables an air mass to be radiated from the outlet portion at a low frequency. As a result, lower bass range components are emphasized to realize a superior live feeling.

EXAMPLE 7

Speaker systems were produced in the same manner as in Example 2 with the distance between a maximum projecting portion of the acoustic load section and the speaker unit being changed, and their f0 were measured. For comparison, f0 of the speaker unit of this embodiment alone was measured. Table 1 below shows measured values and the decrease rate of f0 of the speaker system according to the present invention relative to f0 of the unit alone.

TABLE 1

| Distance between the unit and the load section (mm) | f0 (Hz) | Decrease rate (%) |
|---|---|---|
| Unit alone | 112 | — |
| 36 | 88 | 21.4 |
| 18 | 71.7 | 36.0 |
| 9 | 68.0 | 39.3 |
| 3 | 66.4 | 40.7 |
| 2 | 62.1 | 44.6 |

As is apparent from Table 1, the maximum projecting portion of the acoustic load section and the speaker unit are preferably located as close to each other as possible without being contacted with each other.

EXAMPLE 8

A 13-cm speaker unit was produced and mounted in a 3-liter closed box (150 W×210 D×140 H). The closed box and a wall member were assembled via an intermediate member in such a maimer that the unit was opposed to the wall member at an interval of 18 mm, thereby producing a speaker system as shown in FIGS. 14 and 7. The intermediate member was shaped to have a sound radiation component space height of 18 mm, an outlet portion width of 26 mm, a connection width of 60 mm, and a port length of 71 mm. A portion of the intermediate member which constitutes an enclosure was formed of an MDF (micro density fiber board, a rigid material), and a portion defining a sound radiation component (a wall surface extending from a front cavity to a port) was formed of a polyurethane foam. The polyurethane foam was filled in the entire internal portion of the intermediate member. Furthermore, a felt was stuck to the portion defining a sound radiation component.

Figure 25:
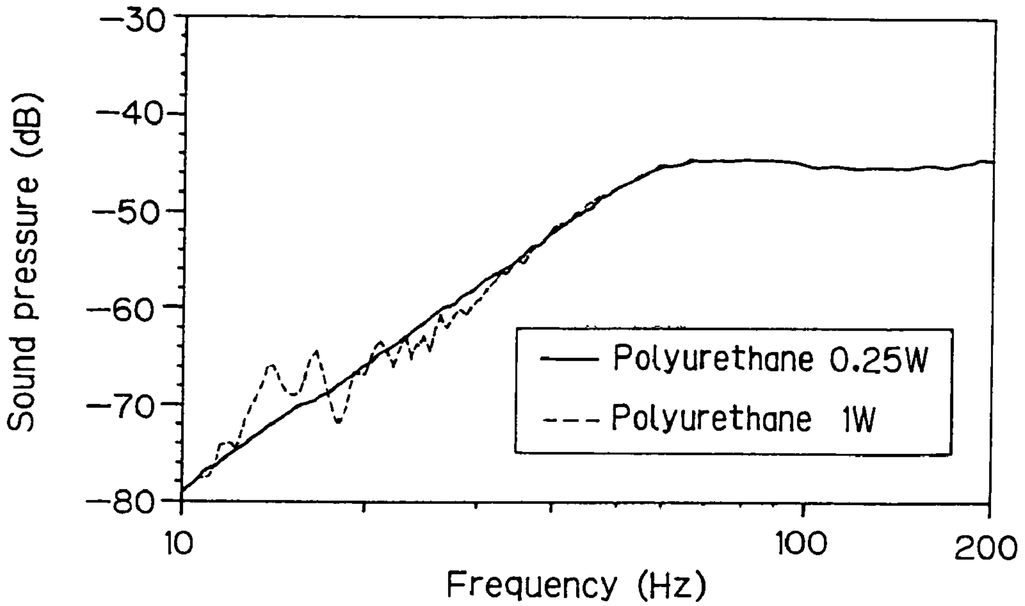
FIG. 25 is a graph showing results of measurements of the transfer function for the speaker system according to the present invention, the results being obtained when inputs are varied.
Figure 26:
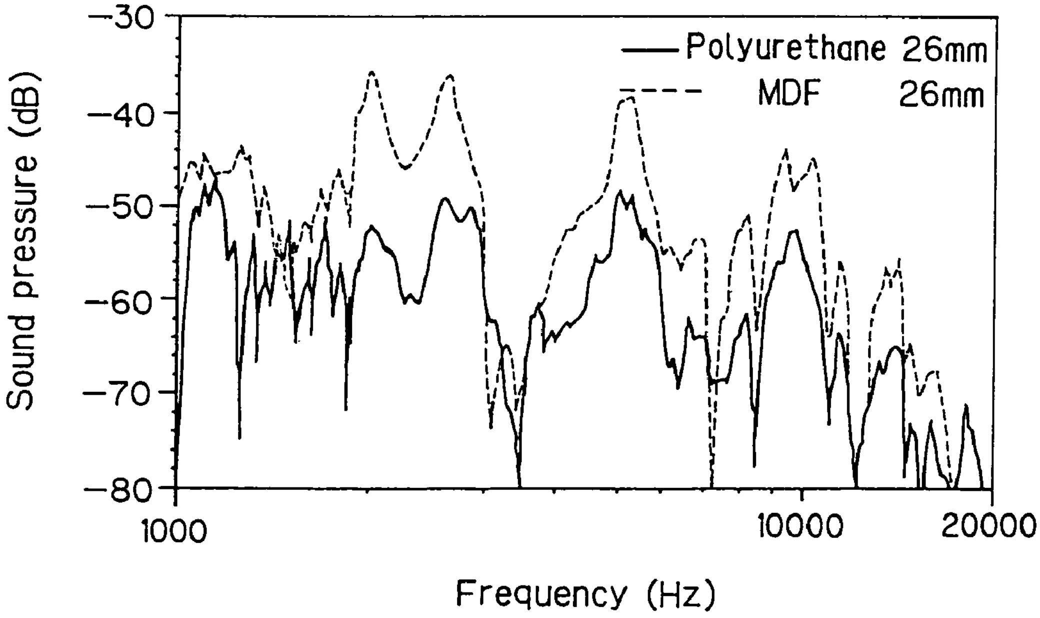
FIG. 26 is a graph for comparing the speaker system according to the present invention with a speaker system according to a comparative example in terms of the occurrence of wind noise.

The transfer function of the speaker system obtained was measured for a 1-V load (0.25 W) and a 2-V load (1 W) using a typical method. Results are shown in FIG. 25. Further, wind noise occurring with the 2-V load was measured using a typical method. Results are shown in FIG. 26 together with results for Comparative Example 1 described later.

In addition, f0 of the speaker system obtained was measured using a typical method. On the other hand, the speaker unit mounted in the closed box was operated alone, and its f0 was measured. As a result, the speaker system according to the present invention had f0 of 58 Hz, and the unit alone had f0 of 101 Hz. This result showed that the speaker system according to the present invention has about 43% lower f0 than the units alone. That is, this embodiment significantly widens the bass reproduction band compared to conventional small-sized speakers.

Comparative Example 1

A speaker system was produced in the same manner as in Example 8 except for the use of an intermediate member consisting only of the MDF. The speaker system obtained was measured for its transfer function similarly to Example 8. Further, the system was measured for its wind noise similarly to Example 8. Results are shown in FIG. 26.

Figure 27:
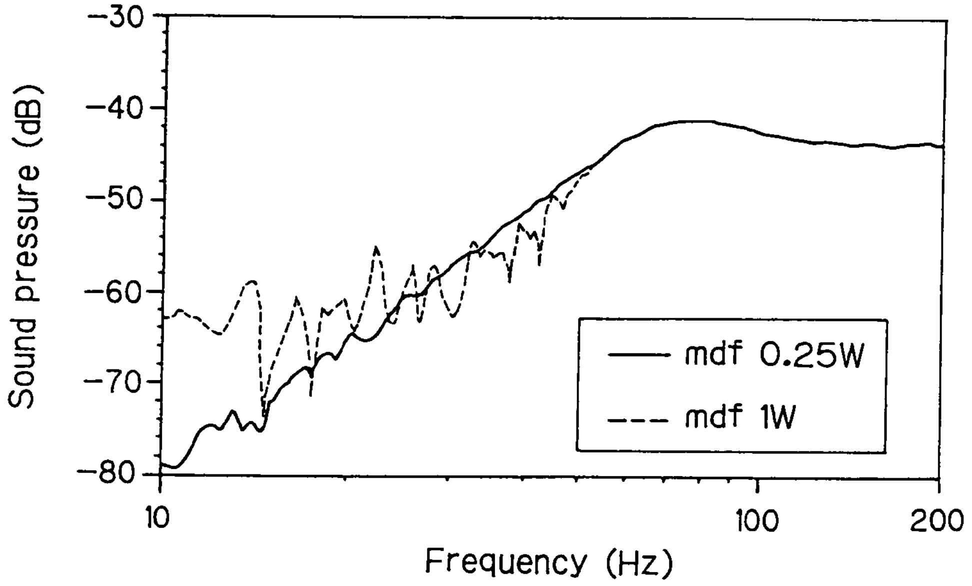
FIG. 27 is a graph showing results of measurements of the transfer function for the speaker system according to the comparative example, the results being obtained when inputs are varied.

As is apparent from comparison between FIGS. 25 and 27, the speaker system according to Example 8 indicates fewer variations between a small input and a large input in frequency response than the speaker system according to Comparative Example 1. In other words, the speaker system of Example 8 indicates superior frequency response to that of the speaker system Comparative Example 1 when the large input is applied. Further, as is apparent from FIG. 26, the speaker system of Example 8 that includes the defining portion formed of the pressure absorbing material undergoes much less wind noise in the treble range than the speaker system of Comparative Example 1.

EXAMPLE 9

Two 10-cm speaker units were produced in accordance with the same specification and each was mounted in 2-liter (124 W×218 D×115 H) enclosure. These enclosures were assembled via an intermediate member in such a manner that the units were opposed to each other at an interval of 18 mm, thereby producing a speaker system as shown in FIGS. 12 to 14. The intermediate member was shaped to have a sound radiation component space height of 18 mm, an outlet portion width of 26 mm, a connection width of 60 mm, and a port length of 71 mm. A portion defining a wall surface extending from a front cavity to a port was formed of a polyurethane form. Furthermore, a felt was stuck to this portion.

f0 of the speaker system obtained was measured using a typical method. On the other hand, the speaker unit mounted in the enclosure was operated alone, and its f0 was measured. As a result, the speaker system according to the present invention had f0 of 57 Hz, and the units alone had f0 of 90 Hz. This result showed that the speaker system according to the present invention has about 37% lower f0 than the units alone. That is, this example significantly widens the bass reproduction band compared to conventional small-sized speakers.

Comparative Example 2

A speaker system was produced in the same manner as in Embodiment 9 except that an intermediate member consisting only of the MDF was used. The speaker system obtained was measured for its transfer function similarly to Example 8.

Like the comparison between Example 8 and Comparative Example 1, comparison between Example 9 and Comparative Example 2 indicated that the speaker system according to Example 9 that includes the defining portion formed of the pressure absorbing material indicates fewer variations between large input and small input in frequency response and undergoes much less wind noise in the treble range.

EXAMPLE 10

Figure 28:
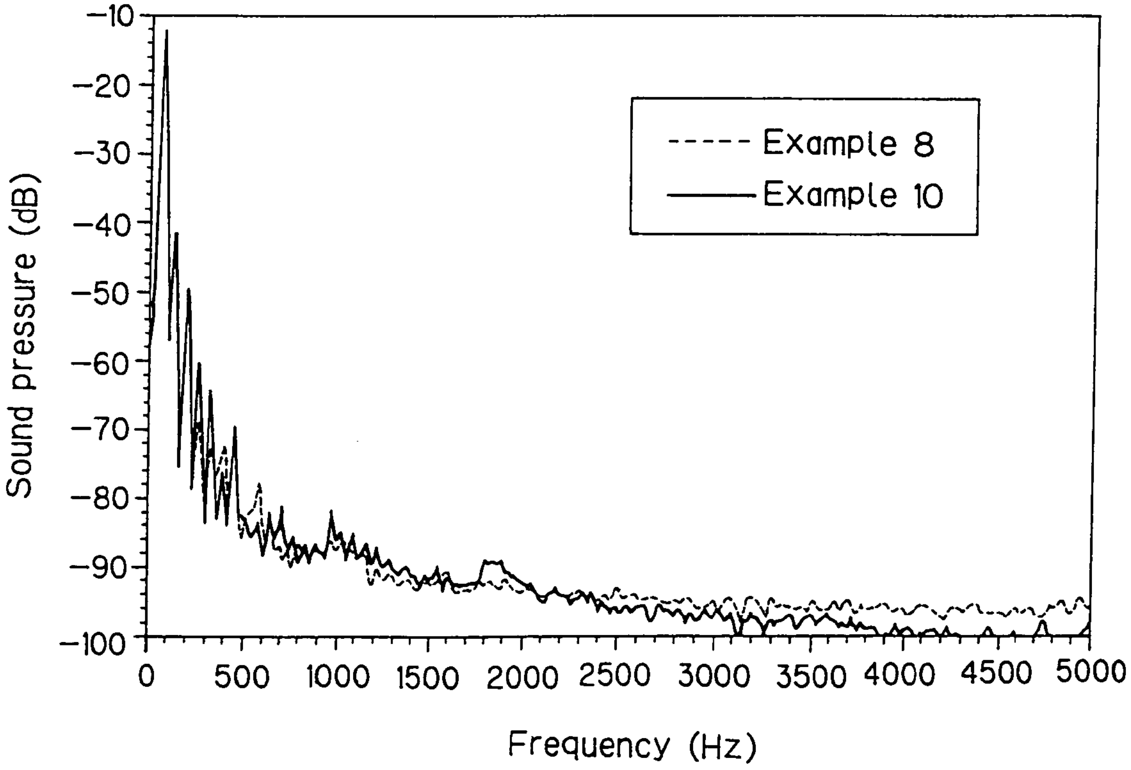
FIG. 28 is a graph showing the frequency response of the speaker system according to the present invention.

A speaker system was produced in the same manner as in Example 8 except that an air portion as shown in FIG. 15 was provided. The frequency response was measured at a front surface of the speaker system when 64 Hz sine waves were input to this speaker system. Results are shown in FIG. 28. For reference, the speaker system according to Example 8 was similarly evaluated. Both results are shown in FIG. 28.

FIG. 28 clearly shows that the air portion serves to further reduce noise of frequency between 2 and 5 kHz, to which human ears are most sensitive (note that the noise level of Example 8 is also satisfactory).

As described above, according to the present invention, a small-sized speaker system having an excellent bass-range reproduction capability is obtained by forming a sound radiation component shaped to cause a larger degree of air compression and expansion than in the case where acoustic waves are directly radiated to a free space with speaker units mounted in an enclosure of the same shape, thereby efficiently guiding variations in pressure radiated from a front cavity of the speaker unit.

Further, according to the preferred embodiment of the present invention, a speaker system having a more excellent bass-range reproduction capability is obtained by constructing a wall defining the sound radiation component using a pressure absorbing material (for example, a polyurethane foam).

In addition, the speaker system according to the present invention indicates no variation due to large input in frequency response and significantly restrains wind noise.

The speaker system according to the present invention is widely available as a small-sized woofer.

Many other modifications are apparent to and are easily made by those skilled in the art without deviating from the scope and spirit of the present invention. Therefore, the accompanying claims are not intended to be limited to the description of the specification but to be construed in a broad sense.

The invention claimed is:

1. A speaker system comprising:

speaker units; and a sound radiation component for guiding acoustic waves radiated from the speaker units to a free space by causing a larger degree of air compression and expansion than in the case where acoustic waves are directly radiated to the free space with the speaker unit mounted in an enclosure alone, wherein said sound radiation component has a front cavity defined in a fashion corresponding to a peripheral portion of said speaker unit and a port for guiding an acoustic wave radiated from the speaker unit to the free space, wherein said port has a width in an intermediate portion thereof which is smaller than those of a connection between the front cavity and the port and of an outlet portion thereof and has a planar shape that is asymmetrical with respect to the axis of the port in an acoustic wave guide-out direction, and wherein the speaker system has 20% or more lower f0 than in the case where acoustic waves are directly radiated to the free space with the speaker unit mounted in the enclosure.

2. A speaker system comprising:

a first speaker unit mounted in a first enclosure;

a second speaker unit mounted in a second enclosure; and an intermediate member disposed between the first and second enclosures in such a manner that the first and second speaker units are opposed to each other at a predetermined distance, the intermediate member defining together with the first and second enclosures, a sound radiation component for guiding acoustic waves radiated from the first and second speaker units out to a free space, wherein said sound radiation component has a front cavity defined in a fashion corresponding to a peripheral portion of said speaker unit and a port for guiding an acoustic wave radiated from the speaker unit to the free space, wherein said port has a width in an intermediate portion thereof which is smaller than those of a connection between the front cavity and the port and of an outlet portion thereof and has a planar shape that is asymmetrical with respect to the axis of the port in an acoustic wave guide-out direction, and wherein the speaker system has 20% or more lower f0 than in the case where acoustic waves are directly radiated to the free space with the speaker unit mounted in an enclosure of the same shape as the enclosure.

3. The speaker system according to claim 2 wherein said first speaker unit and second speaker unit are constructed in accordance with an identical specification.

4. A speaker system comprising:

a speaker unit mounted in an enclosure;

a wall member opposed to the speaker unit at a predetermined distance; and an intermediate member provided between the enclosure and the wall member for defining together with the wall member and enclosure, a sound radiation component for guiding an acoustic wave radiated from the speaker unit out to a free space, wherein said sound radiation component has a front cavity defined in a fashion corresponding to a peripheral portion of said speaker unit and a port for guiding an acoustic wave radiated from the speaker unit to the free space, and wherein said port has a width in an intermediate portion thereof which is smaller than those of a connection between the front cavity and the port and of an outlet portion thereof and has a planar shape that is asymmetrical with respect to the axis of the port in an acoustic wave guide-out direction, and wherein the speaker system has 20% or more lower f0 than in the case where acoustic waves are directly radiated to the free space with the speaker unit mounted in an enclosure of the same shape as the enclosure.

5. The speaker system according to claim 4, wherein said wall member has an acoustic load section in a portion thereof opposed to said speaker unit.

6. The speaker system according to claim 1, wherein a line defining the planar shape of said port comprises a continuous curve.

7. The speaker system according to claim 1, wherein said line defining the planar shape of the port includes at least a straight portion.

8. A speaker system comprising:

a first speaker unit mounted in a first enclosure;

a first wall member opposed to the first speaker unit at a predetermined distance;

a first acoustic load section mounted on the first wall member and opposed to the first speaker unit;

a first intermediate member provided between the first enclosure and the first wall member for defining together with the first wall member and enclosure, a first sound radiation component for guiding an acoustic wave radiated from the first speaker unit out to a free space;

a second speaker unit mounted in a first enclosure;

a second wall member opposed to the first speaker unit at a predetermined distance;

a second acoustic load section mounted on the second wall member and opposed to the second speaker unit; and a second intermediate member provided between the second enclosure and the second wall member for defining together with the second wall member and enclosure, a second sound radiation component for guiding an acoustic wave radiated from the second speaker unit out to a free space;

wherein the first and second speaker units are disposed to oppose to each other, wherein the first sound radiation component has a first front cavity defined in a fashion corresponding to a peripheral portion of the first speaker unit and a first port for guiding an acoustic wave radiated from the first speaker unit to the free space, wherein the second sound radiation component has a second front cavity defined in a fashion corresponding to a peripheral portion of the second speaker unit and a second port for guiding an acoustic wave radiated from the second speaker unit to the free space, wherein the first port has a width in an intermediate portion thereof which is smaller than those of a connection between the first front cavity and the first port and of a first outlet portion thereof and has a planar shape that is asymmetrical with respect to the axis of the first port in an acoustic wave guide-out direction, and wherein the second port has a width in an intermediate portion thereof which is smaller than those of a connection between the second front cavity and the second port and of a second outlet portion thereof and has a planar shape that is asymmetrical with respect to the axis of the second port in an acoustic wave guide-out direction.

9. A speaker system comprising:
a first speaker unit mounted in a first enclosure;
a first wall member opposed to the first speaker unit at a predetermined distance;
a first acoustic load section mounted on the first wall member and opposed to the first speaker unit;
a first intermediate member provided between the first enclosure and the first wall member for defining together with the first wall member and enclosure, a first sound radiation component for guiding an acoustic wave radiated from the first speaker unit out to a free space;
a second speaker unit mounted in a first enclosure;
a second wall member opposed to the first speaker unit at a predetermined distance;
a second acoustic load section mounted on the second wall member and opposed to the second speaker unit; and
a second intermediate member provided between the second enclosure and the second wall member for defining together with the second wall member and enclosure, a second sound radiation component for guiding an acoustic wave radiated from the second speaker unit out to a free space;
wherein the first and second speaker units are disposed to oppose to each other,
wherein the first sound radiation component has a first front cavity defined in a fashion corresponding to a peripheral portion of the first speaker unit and a first port for guiding an acoustic wave radiated from the first speaker unit to the free space,
wherein the second sound radiation component has a second front cavity defined in a fashion corresponding to a peripheral portion of the second speaker unit and a second port for guiding an acoustic wave radiated from the second speaker unit to the free space,
wherein the width of a first port decreases monotonously from the connection between a first sound radiation component and the first port, and
wherein at least part of the portion of the first and second intermediate member defining the first and second sound radiation component comprises a material having a pressure absorbing characteristic.

10. The speaker system according to claim 2, wherein a line defining the planar shape of said port comprises a continuous curve.

11. The speaker system according to claim 3, wherein a line defining the planar shape of said port comprises a continuous curve.

12. The speaker system according to claim 4, wherein a line defining the planar shape of said port comprises a continuous curve.

13. The speaker system according to claim 5, wherein a line defining the planar shape of said port comprises a continuous curve.

14. The speaker system according to claim 8, wherein a line defining the planar shape of said port comprises a continuous curve.

15. The speaker system according to claim 2, wherein said line defining the planar shape of the port includes at least a straight portion.

16. The speaker system according to claim 3, wherein said line defining the planar shape of the port includes at least a straight portion.

17. The speaker system according to claim 4, wherein said line defining the planar shape of the port includes at least a straight portion.

18. The speaker system according to claim 5, wherein said line defining the planar shape of the port includes at least a straight portion.

19. The speaker system according to claim 8, wherein said line defining the planar shape of the port includes at least a straight portion.

20. The speaker system according to claim 9, wherein said material having the pressure-absorbing characteristic is a polyurethane foam.

21. The speaker system according to claim 20, wherein said polyurethane foam has an expansion ratio between 2 and 80.

22. The speaker system according to claim 9, wherein said sound radiation component has a pressure adjustment section provided in at least part of a wall surface thereof.

23. The speaker system according to claim 9, wherein the outlet portion of said port is 1/20 to 1/10 of a diaphragm in said speaker unit in area.

24. The speaker system according to claim 9, wherein said material having the pressure absorbing characteristic is partly disposed inside said intermediate member, and an air portion is defined between the material and an inner wall member of the intermediate member.

25. A speaker system comprising:
a speaker unit mounted in an enclosure;
a wall member opposed to the speaker unit at a predetermined distance;
an acoustic load section mounted on the wall member and opposed to the speaker unit; and
an intermediate member provided between the enclosure and the wall member for defining together with the wall member and enclosure, a sound radiation component for guiding an acoustic wave radiated from the speaker unit out to a free space,
wherein the sound radiation component has a front cavity defined in a fashion corresponding to a peripheral portion of said speaker unit and a port for guiding an acoustic wave radiated from the speaker unit to the free space,
wherein the port has a width in an intermediate portion thereof which is smaller than that of a connection between the front cavity and the port, and
wherein at least part of the portion of the intermediate member defining the sound radiation component comprises a material having a pressure absorbing characteristic.

26. A speaker system comprising:
a first speaker unit mounted in a first enclosure;
a second speaker unit mounted in a second enclosure; and
an intermediate member disposed between the first and second enclosures in such a manner that the first and second speaker units are opposed to each other at a predetermined distance, the intermediate member defining together with the first and second enclosures, a sound radiation component for guiding acoustic waves radiated from the first and second speaker units out to a free space,
wherein the sound radiation component has a front cavity defined in a fashion corresponding to a peripheral portion of said speaker unit and a port for guiding an acoustic wave radiated from the speaker unit to the free space, wherein the port has a width in an intermediate portion thereof which is smaller than that of a connection between the front cavity and the port, and wherein at least part of the portion of the intermediate member defining the sound radiation component comprises a polyurethane foam.

* * * * *